United States Patent
Kuiper et al.

(10) Patent No.: US 11,454,027 B2
(45) Date of Patent: Sep. 27, 2022

(54) SYSTEM OF ROOFING AND PHOTOVOLTAIC SHINGLES AND METHODS OF INSTALLING SAME

(71) Applicant: GAF Energy LLC, Parsippany, NJ (US)

(72) Inventors: Michael David Kuiper, Newark, CA (US); Evan Michael Wray, Cotati, CA (US); Daniel East, Rutherfordton, NC (US); Olan T. Leitch, Mt. Juilet, TN (US); Ming-Liang Shiao, Collegeville, PA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/513,161

(22) Filed: Oct. 28, 2021

(65) Prior Publication Data

US 2022/0213689 A1    Jul. 7, 2022

Related U.S. Application Data

(60) Provisional application No. 63/107,237, filed on Oct. 29, 2020.

(51) Int. Cl.
*E04D 1/34* (2006.01)
*H02S 20/25* (2014.01)
(Continued)

(52) U.S. Cl.
CPC ............... *E04D 1/34* (2013.01); *E04D 1/20* (2013.01); *E04D 1/26* (2013.01); *E04D 1/30* (2013.01);
(Continued)

(58) Field of Classification Search
CPC ..... E04D 1/34; E04D 1/20; E04D 1/26; E04D 1/30; E04D 2001/308; H02S 20/25
See application file for complete search history.

(56) References Cited

U.S. PATENT DOCUMENTS 1,981,467 A    11/1934    Radtke
3,156,497 A    11/1964    Lessard
(Continued)

FOREIGN PATENT DOCUMENTS

CA    2829440 A1    4/2014
CH    700095 A2    6/2010
(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.
(Continued)

*Primary Examiner* — Adriana Figueroa
(74) *Attorney, Agent, or Firm* — Greenberg Traurig, LLP

(57) ABSTRACT

A first plurality of roofing shingles installed in on a roof deck, and a second plurality of roofing shingles installed in a second plurality of rows. An edge of one of the second roofing shingles in each of the second rows is offset from the edge of another one of the second roofing shingles in another adjacent one of the second rows. An edge of a first photovoltaic shingle is juxtaposed with the edge of a first roofing shingle of the second roofing shingles in a first row of the second rows. The edge of at least another photovoltaic shingle in at least one of another row of the second rows is substantially aligned with the edge of the first photovoltaic
(Continued)

shingle. An additional roofing shingle is installed intermediate one of the second roofing shingles and one of the photovoltaic shingles.

20 Claims, 12 Drawing Sheets

(51) Int. Cl.
    *E04D 1/20*     (2006.01)
    *E04D 1/26*     (2006.01)
    *E04D 1/30*     (2006.01)

(52) U.S. Cl.
    CPC ........ *H02S 20/25* (2014.12); *E04D 2001/308* (2013.01)

(56) References Cited

U.S. PATENT DOCUMENTS

| | | |
|---|---|---|
| 4,258,948 A | 3/1981 | Hoffmann |
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,316,592 A * | 5/1994 | Dinwoodie ............. H02S 20/25 136/244 |
| 5,590,495 A | 1/1997 | Bressler |
| 5,642,596 A | 7/1997 | Waddington |
| 6,008,450 A | 12/1999 | Ohtsuka et al. |
| 6,046,399 A | 4/2000 | Kapner |
| 6,119,415 A * | 9/2000 | Rinklake ................. E04D 12/00 52/173.3 |
| 6,320,114 B1 | 11/2001 | Kuechler |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,666,491 B2 | 2/2010 | Yang et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Browder |
| 7,832,176 B2 | 11/2010 | McCaskill et al. |
| 8,003,882 B2 * | 8/2011 | Pisklak .................... E04D 1/26 136/246 |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 * | 10/2012 | Lenox .................... E04D 13/172 52/173.3 |
| 8,309,840 B2 * | 11/2012 | Stevens ................. H01L 31/048 136/251 |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,623,499 B2 | 1/2014 | Viasnoff |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,145,498 B2 | 9/2015 | Ultsch |
| 9,117,991 B1 | 10/2015 | Pearce |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rodrigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,528,270 B2 | 12/2016 | Jenkins et al. |
| 9,605,432 B1 | 3/2017 | Robbins |
| 9,670,353 B2 | 6/2017 | Peng et al. |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,920,515 B2 | 3/2018 | Xing et al. |
| 9,923,515 B2 | 3/2018 | Rodrigues et al. |
| 9,938,729 B2 | 4/2018 | Coon |
| 9,987,786 B2 | 6/2018 | Stoiljkovic et al. |
| 9,991,412 B2 | 6/2018 | Gonzalez et al. |
| 9,998,067 B2 | 6/2018 | Kalkanoglu et al. |
| 10,015,933 B2 | 7/2018 | Boldrin |
| 10,027,273 B2 | 7/2018 | West et al. |
| 10,027,275 B2 * | 7/2018 | Friedrich .................. E04D 1/30 |
| 10,115,850 B2 | 10/2018 | Rodrigues et al. |
| 10,128,660 B1 | 11/2018 | Apte et al. |
| 10,179,852 B2 | 1/2019 | Gossi et al. |
| 10,187,005 B2 * | 1/2019 | Rodrigues ............... H02S 20/25 |
| 10,256,765 B2 | 4/2019 | Rodrigues et al. |
| 10,454,408 B2 | 10/2019 | Livsey et al. |
| 10,480,192 B2 | 11/2019 | Xing et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,669,414 B2 | 6/2020 | Li et al. |
| 10,784,813 B2 | 9/2020 | Kalkanoglu et al. |
| D904,289 S | 12/2020 | Lance et al. |
| 10,907,355 B2 | 2/2021 | Hubbard et al. |
| 10,914,063 B2 | 2/2021 | Lee et al. |
| RE48,555 E | 5/2021 | Cancio et al. |
| 11,012,026 B2 | 5/2021 | Kalkanoglu et al. |

(56) References Cited

U.S. PATENT DOCUMENTS

| | | | |
|---|---|---|---|
| 11,015,085 B2 | 5/2021 | Bruns et al. | |
| 11,063,551 B2* | 7/2021 | Friedrich | H01L 31/049 |
| 11,065,849 B2 | 7/2021 | Ackermann et al. | |
| 11,177,639 B1 | 11/2021 | Nguyen et al. | |
| 11,217,715 B2 | 1/2022 | Sharenko et al. | |
| 11,251,744 B1 | 2/2022 | Bunea et al. | |
| 11,258,399 B2 | 2/2022 | Kalkanoglu et al. | |
| 11,283,394 B2 | 3/2022 | Perkins et al. | |
| 2002/0053360 A1 | 5/2002 | Kinoshita et al. | |
| 2002/0102422 A1 | 8/2002 | Hubbard et al. | |
| 2002/0129849 A1 | 9/2002 | Heckeroth | |
| 2003/0101662 A1 | 6/2003 | Ullman | |
| 2003/0132265 A1 | 7/2003 | Villela et al. | |
| 2003/0217768 A1* | 11/2003 | Guha | H02S 20/23 136/244 |
| 2005/0115603 A1 | 6/2005 | Yoshida et al. | |
| 2005/0144870 A1 | 7/2005 | Dinwoodie | |
| 2006/0042683 A1 | 3/2006 | Gangemi | |
| 2007/0181174 A1 | 8/2007 | Ressler | |
| 2007/0193618 A1 | 8/2007 | Bressler et al. | |
| 2007/0249194 A1 | 10/2007 | Liao | |
| 2008/0006323 A1 | 1/2008 | Kalkanoglu et al. | |
| 2008/0035140 A1 | 2/2008 | Placer et al. | |
| 2008/0105291 A1 | 5/2008 | Pisklak et al. | |
| 2008/0271774 A1 | 11/2008 | Kalkanoglu et al. | |
| 2008/0315061 A1 | 12/2008 | Placer et al. | |
| 2009/0000222 A1 | 1/2009 | Kalkanoglu et al. | |
| 2009/0019795 A1 | 1/2009 | Szacsvay et al. | |
| 2009/0044850 A1 | 2/2009 | Kimberley | |
| 2009/0114261 A1 | 5/2009 | Stancel et al. | |
| 2009/0133340 A1 | 5/2009 | Shiao et al. | |
| 2009/0159118 A1 | 6/2009 | Kalkanoglu | |
| 2009/0178350 A1 | 7/2009 | Kalkanoglu et al. | |
| 2009/0229652 A1 | 9/2009 | Mapel et al. | |
| 2010/0019580 A1 | 1/2010 | Croft et al. | |
| 2010/0101634 A1 | 4/2010 | Frank et al. | |
| 2010/0139184 A1 | 6/2010 | Williams et al. | |
| 2010/0146878 A1 | 6/2010 | Koch et al. | |
| 2010/0159221 A1 | 6/2010 | Kourtakis et al. | |
| 2010/0313499 A1 | 12/2010 | Gangemi | |
| 2010/0326488 A1 | 12/2010 | Aue et al. | |
| 2010/0326501 A1 | 12/2010 | Zhao et al. | |
| 2011/0030761 A1 | 2/2011 | Kalkanoglu et al. | |
| 2011/0036386 A1 | 2/2011 | Browder | |
| 2011/0036389 A1 | 2/2011 | Hardikar et al. | |
| 2011/0048507 A1 | 3/2011 | Livsey et al. | |
| 2011/0058337 A1 | 3/2011 | Han | |
| 2011/0061326 A1* | 3/2011 | Jenkins | E04D 1/26 52/518 |
| 2011/0100436 A1 | 5/2011 | Cleereman et al. | |
| 2011/0104488 A1 | 5/2011 | Muessig et al. | |
| 2011/0132427 A1 | 6/2011 | Kalkanoglu et al. | |
| 2011/0239555 A1 | 10/2011 | Cook et al. | |
| 2011/0302859 A1 | 12/2011 | Crasnianski | |
| 2012/0060902 A1 | 3/2012 | Drake | |
| 2012/0137600 A1 | 6/2012 | Jenkins | |
| 2012/0176077 A1 | 7/2012 | Oh et al. | |
| 2012/0212065 A1 | 8/2012 | Cheng et al. | |
| 2012/0233940 A1 | 9/2012 | Perkins et al. | |
| 2012/0240490 A1 | 9/2012 | Gangemi | |
| 2012/0260977 A1 | 10/2012 | Stancel | |
| 2012/0266942 A1 | 10/2012 | Komatsu et al. | |
| 2012/0279150 A1 | 11/2012 | Pisklak et al. | |
| 2013/0008499 A1 | 1/2013 | Verger et al. | |
| 2013/0014455 A1 | 1/2013 | Grieco | |
| 2013/0193769 A1 | 8/2013 | Mehta et al. | |
| 2013/0247988 A1 | 9/2013 | Reese et al. | |
| 2013/0284267 A1 | 10/2013 | Plug et al. | |
| 2013/0306137 A1 | 11/2013 | Ko | |
| 2014/0090697 A1 | 4/2014 | Rodrigues et al. | |
| 2014/0150843 A1 | 6/2014 | Pearce et al. | |
| 2014/0173997 A1 | 6/2014 | Jenkins | |
| 2014/0179220 A1 | 6/2014 | Railkar et al. | |
| 2014/0254776 A1 | 9/2014 | O'Connor et al. | |
| 2014/0311556 A1 | 10/2014 | Feng et al. | |
| 2014/0352760 A1 | 12/2014 | Haynes et al. | |
| 2014/0366464 A1 | 12/2014 | Rodrigues et al. | |
| 2015/0024159 A1 | 1/2015 | Bess et al. | |
| 2015/0089895 A1 | 4/2015 | Leitch | |
| 2015/0340516 A1 | 11/2015 | Kim et al. | |
| 2015/0349173 A1 | 12/2015 | Morad et al. | |
| 2016/0105144 A1 | 4/2016 | Haynes et al. | |
| 2016/0254776 A1 | 9/2016 | Rodrigues et al. | |
| 2016/0276508 A1 | 9/2016 | Huang et al. | |
| 2016/0359451 A1 | 12/2016 | Mao et al. | |
| 2017/0159292 A1 | 6/2017 | Chihlas et al. | |
| 2017/0179726 A1 | 6/2017 | Garrity et al. | |
| 2017/0203555 A1 | 7/2017 | Wang et al. | |
| 2017/0331415 A1 | 11/2017 | Koppi et al. | |
| 2018/0094438 A1 | 4/2018 | Wu et al. | |
| 2018/0094439 A1 | 4/2018 | Wang et al. | |
| 2018/0097472 A1 | 4/2018 | Anderson et al. | |
| 2018/0281347 A1 | 10/2018 | Gossi | |
| 2018/0351502 A1 | 12/2018 | Almy et al. | |
| 2019/0030867 A1 | 1/2019 | Sun et al. | |
| 2019/0081436 A1 | 3/2019 | Onodi et al. | |
| 2019/0305717 A1 | 10/2019 | Allen et al. | |
| 2020/0020819 A1 | 1/2020 | Farhangi | |
| 2020/0109320 A1 | 4/2020 | Jiang | |
| 2020/0144958 A1 | 5/2020 | Rodrigues et al. | |
| 2020/0220819 A1 | 7/2020 | Vu et al. | |
| 2020/0224419 A1 | 7/2020 | Boss et al. | |
| 2020/0343397 A1 | 10/2020 | Hem-Jensen | |
| 2021/0002898 A1 | 1/2021 | Knebel et al. | |
| 2021/0095474 A1 | 4/2021 | Yang et al. | |
| 2021/0113970 A1 | 4/2021 | Stainer et al. | |
| 2021/0115223 A1 | 4/2021 | Bonekamp et al. | |
| 2021/0159353 A1 | 5/2021 | Li et al. | |
| 2021/0171808 A1 | 6/2021 | Ackermann et al. | |
| 2021/0172174 A1 | 6/2021 | Ackermann et al. | |

FOREIGN PATENT DOCUMENTS

| | | |
|---|---|---|
| CN | 202797032 U | 3/2013 |
| DE | 1958248 A1 | 11/1971 |
| EP | 1837162 A1 | 9/2007 |
| EP | 1774372 A1 | 7/2011 |
| EP | 2784241 A1 | 10/2014 |
| JP | 2001-098703 A | 10/2002 |
| JP | 2017-027735 A | 2/2017 |
| WO | 2011/049944 A1 | 4/2011 |
| WO | 2015/133632 A1 | 9/2015 |
| WO | 2019/201416 A1 | 10/2019 |

OTHER PUBLICATIONS

RGS Energy, 3.5kW POWERHOUSE 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing <<https://www.owenscorning.com/en-us/roofing/tools/how-roofing-underlayment-helps-protect-your-home>> retrieved Nov. 1, 2021.

* cited by examiner

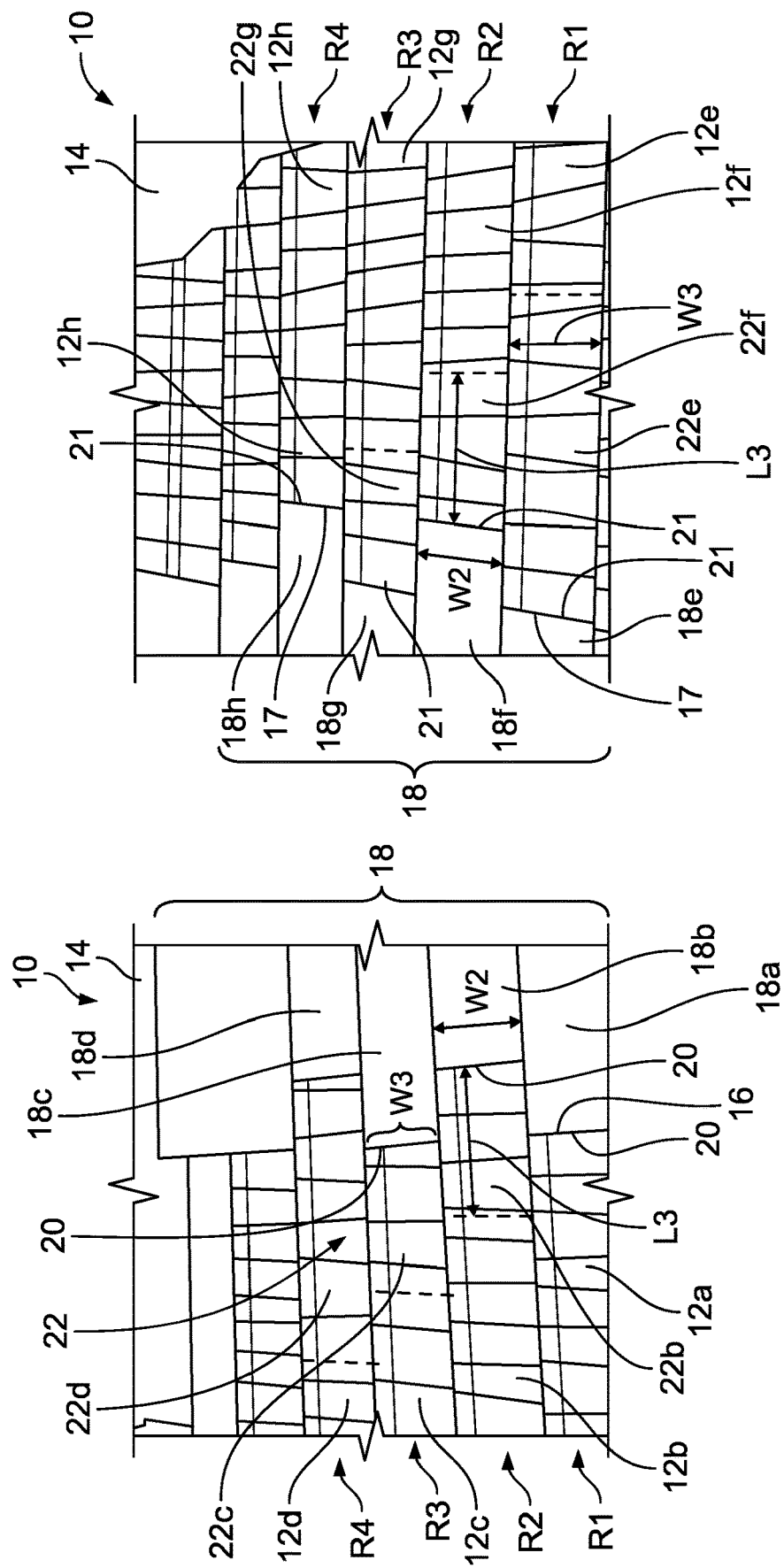

SYSTEM OF ROOFING AND PHOTOVOLTAIC SHINGLES AND METHODS OF INSTALLING SAME

CROSS-REFERENCE TO RELATED APPLICATION

This application is a Section 111(a) application relating to and claiming the benefit of commonly-owned, U.S. Provisional Patent Application Ser. No. 63/107,237, filed Oct. 29, 2020, entitled "SYSTEM OF ROOFING AND PHOTOVOLTAIC SHINGLES AND METHODS OF INSTALLING SAME," the contents of which are incorporated herein by reference in its entirety.

FIELD OF THE INVENTION

The present invention relates to a system of roofing shingles and photovoltaic shingles and methods for installing same.

BACKGROUND OF THE INVENTION

Photovoltaic systems having solar shingles are commonly installed on roofing of structures. What is needed is an efficient method of installing a system of roofing shingles and photovoltaic shingles that minimizes shingle waste.

SUMMARY OF THE INVENTION

In some embodiments, a method, comprising the steps of: installing a first plurality of roofing shingles in on a roof deck; installing a plurality of photovoltaic shingles in a second plurality of rows on the roof deck, wherein the second plurality of rows is above the first plurality of rows, wherein each of the plurality of photovoltaic shingles includes a first edge and a length; installing a second plurality of roofing shingles in the second plurality of rows on the roof deck, wherein each of the second plurality of roofing shingles includes a first length and a first edge, wherein the first edge of one of the second plurality of roofing shingles in each of the second plurality of rows is offset from the first edge of another one of the second plurality of roofing shingles in another adjacent one of the second plurality of rows in a direction along the first length of the another one of the second plurality of roofing shingles; wherein the first edge of a first photovoltaic shingle of the plurality of photovoltaic shingles is juxtaposed with the first edge of a first roofing shingle of the second plurality of roofing shingles in a first row of the second plurality of rows, wherein the first edge of at least one of another of the plurality of photovoltaic shingles in at least one of another row of the second plurality of rows is substantially aligned with the first edge of the first photovoltaic shingle; installing a third plurality of roofing shingles on the roof deck, wherein at least one of the third plurality of roofing shingles is installed intermediate a corresponding one of the second plurality of roofing shingles and one of the plurality of photovoltaic shingles in each of the at least one of another of the plurality of rows; and installing a fourth plurality of roofing shingles in a third plurality of rows on the roof deck, wherein the third plurality of rows is above the second plurality of rows.

In some embodiments, each of the third plurality of roofing shingles includes a second length that is a multiple of one-quarter of the first length, one-half of the first length, three-quarters of the first length, or one of the first length. In some embodiments, a total length of the at least one of the third plurality of roofing shingles in each row of the second plurality of rows increases by a multiple of one. In some embodiments, a total length of the at least one of the third plurality of roofing shingles in each of every two rows of the second plurality of rows increases by a multiple of one and one-half. In some embodiments, each of the first plurality of roofing shingles, the second plurality of roofing shingles, the third plurality of roofing shingles, and the fourth plurality of roofing shingles is an asphalt shingle. In some embodiments, the first length of each of the second plurality of roofing shingles in a range of 5 inches to 60 inches. In some embodiments, the offset of the first edge of the one of the second plurality of roofing shingles in each of the second plurality of rows from the first edge of the another one of the second plurality of roofing shingles in the another adjacent one of the second plurality of rows is a whole number multiple of the first length of the another one of the second plurality of roofing shingles divided by an integer. In some embodiments, the integer is selected from the group consisting of 1, 2, 3, 4, 5, 6, 7, 8, 9, 10, 11, 12, 13, 14, 15, 16, 17, 18, 19, and 20. In some embodiments, each of the first plurality of roofing shingles, the second plurality of roofing shingles, the third plurality of roofing shingles, and the fourth plurality of roofing shingles includes a width and a reveal portion, wherein the reveal portion includes an exposure height, and wherein the width is two times the exposure height plus 2 inches. In some embodiments, each of the plurality of photovoltaic shingles includes a width, and wherein the width of each of the first plurality of roofing shingles, the second plurality of roofing shingles, the third plurality of roofing shingles, and the fourth plurality of roofing shingles is substantially the same as the width of the photovoltaic shingles.

In some embodiments, a system includes a first plurality of roofing shingles installed in a on a roof deck; a second plurality of roofing shingles installed in a second plurality of rows on the roof deck, wherein the second plurality of rows is above the first plurality of rows, wherein each of the second plurality of roofing shingles includes a first length and a first edge, wherein the first edge of one of the second plurality of roofing shingles in each of the second plurality of rows is offset from the first edge of another one of the second plurality of roofing shingles in another adjacent one of the second plurality of rows in a direction along the first length of the another one of the second plurality of roofing shingles; a plurality of photovoltaic shingles installed on the roof deck, wherein each of the plurality of photovoltaic shingles includes a first edge and a length, wherein the first edge of a first photovoltaic shingle of the plurality of photovoltaic shingles is juxtaposed with the first edge of a first roofing shingle of the second plurality of roofing shingles in a first row of the second plurality of rows, wherein the first edge of at least one of another of the plurality of photovoltaic shingles in at least one of another row of the second plurality of rows is substantially aligned with the first edge of the first photovoltaic shingle; and a third plurality of roofing shingles installed on the roof deck, wherein at least one of the third plurality of roofing shingles is installed intermediate a corresponding one of the second plurality of roofing shingles and one of the plurality of photovoltaic shingles in each of the at least one of another of the second plurality of rows; and a fourth plurality of roofing shingles installed in a third plurality of rows on the roof deck, wherein the third plurality of rows is above the second plurality of rows.

In some embodiments, each of the third plurality of roofing shingles includes a second length that is a multiple of one-quarter of the first length, one-half of the first length, three-quarters of the first length, or one of the first length. In some embodiments, a total length of the at least one of the third plurality of roofing shingles in each row of the second plurality of rows increases by a multiple of one. In some embodiments, a total length of the at least one of the third plurality of roofing shingles in each of every two rows of the second plurality of rows increases by a multiple of one and one-half. In some embodiments, each of the first plurality of roofing shingles, the second plurality of roofing shingles, the third plurality of roofing shingles, and the fourth plurality of roofing shingles is an asphalt shingle. In some embodiments, the first length of each of the second plurality of roofing shingles in a range of 10 inches to 60 inches. In some embodiments, the offset of the first edge of the one of the second plurality of roofing shingles in each of the second plurality of rows from the first edge of the another one of the second plurality of roofing shingles in the another adjacent one of the second plurality of rows is a whole number multiple of the first length of the another one of the second plurality of roofing shingles divided by an integer. In some embodiments, the integer is selected from the group consisting of 1, 2, 3, 4, 5, 6, 7, 8, 9, 10, 11, 12, 13, 14, 15, 16, 17, 18, 19, and 20. In some embodiments, each of the first plurality of roofing shingles, the second plurality of roofing shingles, the third plurality of roofing shingles, and the fourth plurality of roofing shingles includes a width and a reveal portion, wherein the reveal portion includes an exposure height, and wherein the width is two times the exposure height plus 2 inches. In some embodiments, each of the plurality of photovoltaic shingles includes a width, and wherein the width of each of the first plurality of roofing shingles, the second plurality of roofing shingles, the third plurality of roofing shingles, and the fourth plurality of roofing shingles is substantially the same as the width of the photovoltaic shingles.

In some embodiments, a kit including a plurality of roofing shingles configured to be installed on a roof deck; and a plurality of photovoltaic shingles configured to be installed on the roof deck, wherein a first group of the roofing shingles is configured to be installed in a first plurality of rows on the roof deck, wherein a second group of the roofing shingles is configured to be installed in a second plurality of rows on the roof deck, wherein the second plurality of rows is above the first plurality of rows, wherein each of the second group of the roofing shingles includes a first length and a first edge, wherein the first edge of one of the second group of the roofing shingles in each of the second plurality of rows is configured to be offset from the first edge of another one of the second group of the roofing shingles in another adjacent one of the second plurality of rows in a direction along the first length of the another one of the second group of the roofing shingles, wherein each of the plurality of photovoltaic shingles includes a first edge and a length, wherein the first edge of a first photovoltaic shingle of the plurality of photovoltaic shingles is configured to be juxtaposed with the first edge of a first roofing shingle of the second group of roofing shingles in a first row of the second plurality of rows, wherein the first edge of at least one of another of the plurality of photovoltaic shingles in at least one of another row of the second plurality of rows is configured to be substantially aligned with the first edge of the first photovoltaic shingle, wherein a third group of the roofing shingles is configured to be installed on the roof deck, wherein at least one of the third group of the roofing shingles is configured to be installed intermediate a corresponding one of the second group of the roofing shingles and one of the plurality of photovoltaic shingles in each of the at least one of another of the second plurality of rows, and wherein a fourth group of the roofing shingles is configured to be installed in a third plurality of rows on the roof deck, wherein the third plurality of rows is configured to be above the second plurality of rows.

In some embodiments, each of the third group of the roofing shingles is configured to include a second length that is a multiple of one-quarter of the first length, one-half of the first length, three-quarters of the first length, and one of the first length. In some embodiments, a total length of the at least one of the third group of the roofing shingles in each row of the second plurality of rows is configured to increase by a multiple of one. In some embodiments, a total length of the at least one of the third group of the roofing shingles in each of every two rows of the second plurality of rows is configured to increase by a multiple of one and one-half. In some embodiments, each of the plurality of roofing shingles is an asphalt shingle. In some embodiments, the first length of each of the second group of the roofing shingles is 10 inches to 60 inches. In some embodiments, each of the first plurality of roofing shingles, the second plurality of roofing shingles, the third plurality of roofing shingles, and the fourth plurality of roofing shingles includes a width and a reveal portion, wherein the reveal portion includes an exposure height, and wherein the width is two times the exposure height plus 2 inches. In some embodiments, each of the plurality of photovoltaic shingles includes a width, and wherein the width of each of the first plurality of roofing shingles, the second plurality of roofing shingles, the third plurality of roofing shingles, and the fourth plurality of roofing shingles is substantially the same as the width of the photovoltaic shingles.

BRIEF DESCRIPTION OF THE DRAWINGS

FIGS. 4 and 5 are photos of a plurality of roofing shingles booked into an array of a plurality of photovoltaic shingles;

DETAILED DESCRIPTION

Figure 1:
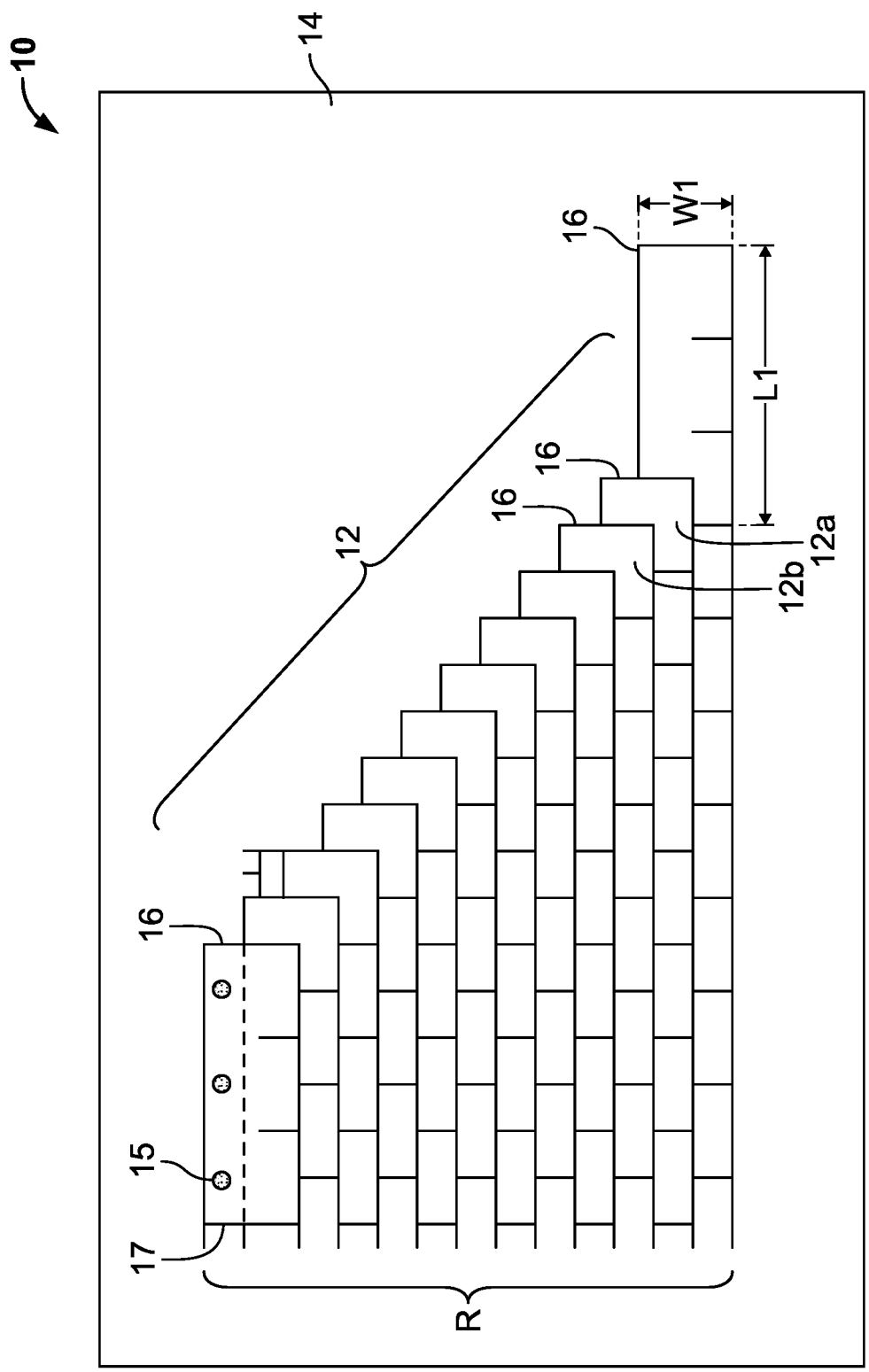
FIG. 1 is a top elevational view of a plurality of roofing shingles installed on a roof deck in a stair step (booked) pattern.
Figure 2:
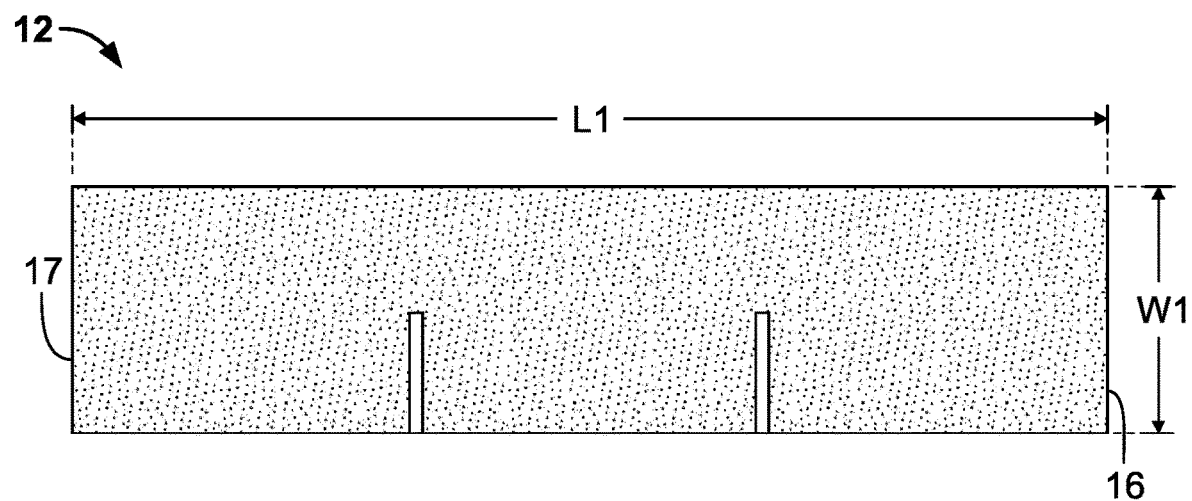
FIG. 2 is a top elevational view of an embodiment of a roofing shingle.
Figure 3:
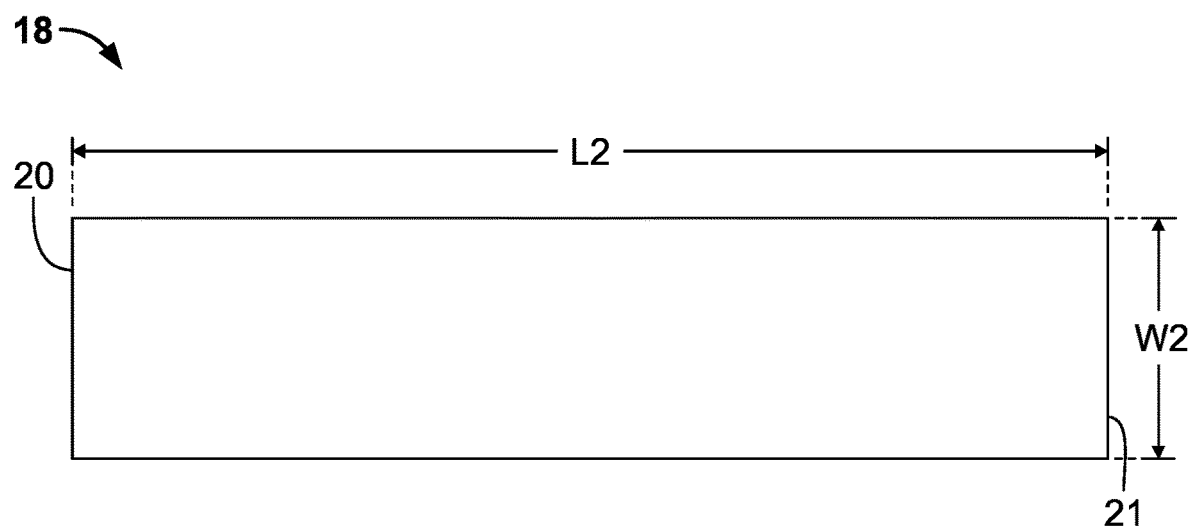
FIG. 3 is a top elevational view of an embodiment of a photovoltaic shingle.

Referring to FIGS. 1 through 3, in some embodiments, a roofing system 10 includes a plurality of roofing shingles 12. In some embodiments, the plurality of roofing shingles 12 is installed in a plurality of rows R on a roof deck 14. In some embodiments, the plurality of roofing shingles 12 is installed on the roof deck 14 in a stair step (i.e., booked) pattern. In some embodiments, each of the plurality of roofing shingles 12 includes a length L1, a width W1, a first edge 16 and a second edge 17 opposite the first edge 16. In some embodiments, the first edge 16 of one roofing shingle 12a of the plurality of roofing shingles 12 in each of the plurality of rows R is offset from the first edge 16 of another roofing shingle 12b of the plurality of roofing shingles 12 in another adjacent one of the plurality of rows R in a direction along the length L1 of the roofing shingle 12b.

In some embodiments, each of the plurality of roofing shingles 12 is an asphalt shingle. In some embodiments, each of the plurality of roofing shingles 12 is composed of a polymer. In some embodiments, each of the plurality of roofing shingles 12 includes thermoplastic polyolefin (TPO). In other embodiments, each of the plurality of roofing shingles 12 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide; polyvinyl chloride (PVC); ethylene propylene diene monomer (EPDM) rubber; silicone rubber; fluoropolymers-ethylene tetrafluoroethylene (ETFE), polyvinylidene fluoride (PVDF), tetrafluoroethylene-hexafluoropropylene copolymers (FEP), and tetrafluoroethylene-hexafluoropropylene-vinylidene fluoride copolymers (THV), or blends thereof.

In some embodiments, each of the plurality of roofing shingles 12 is adapted to be affixed to the roof deck 14 by a plurality of fasteners 15. In some embodiments, the plurality of fasteners 15 includes a plurality of nails. In some embodiments, the plurality of fasteners 15 includes a plurality of screws. In some embodiments, the plurality of fasteners 15 includes a plurality of staples. In some embodiments, the plurality of fasteners 15 includes a plurality of rivets. In some embodiments, each of the plurality of roofing shingles 12 is adapted to be affixed to the roof deck 14 by an adhesive.

In some embodiments, the length L1 of each of the plurality of roofing shingles 12 is in a range of 10 inches to 60 inches. In some embodiments, the length L1 of each of the plurality of roofing shingles 12 is in a range of 10 inches to 55 inches. In some embodiments, the length L1 of each of the plurality of roofing shingles 12 is in a range of 10 inches to 50 inches. In some embodiments, the length L1 of each of the plurality of roofing shingles 12 is in a range of 10 inches to 45 inches. In some embodiments, the length L1 of each of the plurality of roofing shingles 12 is in a range of 10 inches to 40 inches. In some embodiments, the length L1 of each of the plurality of roofing shingles 12 is in a range of 10 inches to 35 inches. In some embodiments, the length L1 of each of the plurality of roofing shingles 12 is in a range of 10 inches to 30 inches. In some embodiments, the length L1 of each of the plurality of roofing shingles 12 is in a range of 10 inches to 25 inches. In some embodiments, the length L1 of each of the plurality of roofing shingles 12 is in a range of 10 inches to 20 inches. In some embodiments, the length L1 of each of the plurality of roofing shingles 12 is in a range of 10 inches to 15 inches.

In some embodiments, the length L1 of each of the plurality of roofing shingles 12 is in a range of 15 inches to 60 inches. In some embodiments, the length L1 of each of the plurality of roofing shingles 12 is in a range of 15 inches to 55 inches. In some embodiments, the length L1 of each of the plurality of roofing shingles 12 is in a range of 15 inches to 50 inches. In some embodiments, the length L1 of each of the plurality of roofing shingles 12 is in a range of 15 inches to 45 inches. In some embodiments, the length L1 of each of the plurality of roofing shingles 12 is in a range of 15 inches to 40 inches. In some embodiments, the length L1 of each of the plurality of roofing shingles 12 is in a range of 15 inches to 35 inches. In some embodiments, the length L1 of each of the plurality of roofing shingles 12 is in a range of 15 inches to 30 inches. In some embodiments, the length L1 of each of the plurality of roofing shingles 12 is in a range of 15 inches to 25 inches. In some embodiments, the length L1 of each of the plurality of roofing shingles 12 is in a range of 15 inches to 20 inches.

In some embodiments, the length L1 of each of the plurality of roofing shingles 12 is in a range of 20 inches to 60 inches. In some embodiments, the length L1 of each of the plurality of roofing shingles 12 is in a range of 20 inches to 55 inches. In some embodiments, the length L1 of each of the plurality of roofing shingles 12 is in a range of 20 inches to 50 inches. In some embodiments, the length L1 of each of the plurality of roofing shingles 12 is in a range of 20 inches to 45 inches. In some embodiments, the length L1 of each of the plurality of roofing shingles 12 is in a range of 20 inches to 40 inches. In some embodiments, the length L1 of each of the plurality of roofing shingles 12 is in a range of 20 inches to 35 inches. In some embodiments, the length L1 of each of the plurality of roofing shingles 12 is in a range of 20 inches to 30 inches. In some embodiments, the length L1 of each of the plurality of roofing shingles 12 is in a range of 20 inches to 25 inches.

In some embodiments, the length L1 of each of the plurality of roofing shingles 12 is in a range of 25 inches to 60 inches. In some embodiments, the length L1 of each of the plurality of roofing shingles 12 is in a range of 25 inches to 55 inches. In some embodiments, the length L1 of each of the plurality of roofing shingles 12 is in a range of 25 inches to 50 inches. In some embodiments, the length L1 of each of the plurality of roofing shingles 12 is in a range of 25 inches to 45 inches. In some embodiments, the length L1 of each of the plurality of roofing shingles 12 is in a range of 25 inches to 40 inches. In some embodiments, the length L1 of each of the plurality of roofing shingles 12 is in a range of 25 inches to 35 inches. In some embodiments, the length L1 of each of the plurality of roofing shingles 12 is in a range of 25 inches to 30 inches.

In some embodiments, the length L1 of each of the plurality of roofing shingles 12 is in a range of 30 inches to 60 inches. In some embodiments, the length L1 of each of the plurality of roofing shingles 12 is in a range of 30 inches to 55 inches. In some embodiments, the length L1 of each of the plurality of roofing shingles 12 is in a range of 30 inches to 50 inches. In some embodiments, the length L1 of each of the plurality of roofing shingles 12 is in a range of 30 inches to 45 inches. In some embodiments, the length L1 of each of the plurality of roofing shingles 12 is in a range of 30 inches to 40 inches. In some embodiments, the length L1 of each of the plurality of roofing shingles 12 is in a range of 30 inches to 35 inches.

In some embodiments, the length L1 of each of the plurality of roofing shingles 12 is in a range of 35 inches to 60 inches. In some embodiments, the length L1 of each of the plurality of roofing shingles 12 is in a range of 35 inches to 55 inches. In some embodiments, the length L1 of each of the plurality of roofing shingles 12 is in a range of 35 inches to 50 inches. In some embodiments, the length L1 of each of the plurality of roofing shingles 12 is in a range of 35 inches to 45 inches. In some embodiments, the length L1 of each of the plurality of roofing shingles 12 is in a range of 35 inches to 40 inches.

In some embodiments, the length L1 of each of the plurality of roofing shingles 12 is in a range of 40 inches to 60 inches. In some embodiments, the length L1 of each of the plurality of roofing shingles 12 is in a range of 40 inches to 55 inches. In some embodiments, the length L1 of each of the plurality of roofing shingles 12 is in a range of 40 inches to 50 inches. In some embodiments, the length L1 of each of the plurality of roofing shingles 12 is in a range of 40 inches to 45 inches.

In some embodiments, the length L1 of each of the plurality of roofing shingles 12 is in a range of 45 inches to 60 inches. In some embodiments, the length L1 of each of the plurality of roofing shingles 12 is in a range of 45 inches to 55 inches. In some embodiments, the length L1 of each of the plurality of roofing shingles 12 is in a range of 45 inches to 50 inches.

In some embodiments, the length L1 of each of the plurality of roofing shingles 12 is in a range of 50 inches to 60 inches. In some embodiments, the length L1 of each of the plurality of roofing shingles 12 is in a range of 50 inches to 55 inches. In some embodiments, the length L1 of each of the plurality of roofing shingles 12 is in a range of 55 inches to 60 inches.

In some embodiments, the length L1 of each of the plurality of roofing shingles 12 is 10 inches. In some embodiments, the length L1 of each of the plurality of roofing shingles 12 is 15 inches. In some embodiments, the length L1 of each of the plurality of roofing shingles 12 is 20 inches. In some embodiments, the length L1 of each of the plurality of roofing shingles 12 is 25 inches. In some embodiments, the length L1 of each of the plurality of roofing shingles 12 is 30 inches. In some embodiments, the length L1 of each of the plurality of roofing shingles 12 is 35 inches. In some embodiments, the length L1 of each of the plurality of roofing shingles 12 is 40 inches. In some embodiments, the length L1 of each of the plurality of roofing shingles 12 is 45 inches. In some embodiments, the length L1 of each of the plurality of roofing shingles 12 is 50 inches. In some embodiments, the length L1 of each of the plurality of roofing shingles 12 is 55 inches. In some embodiments, the length L1 of each of the plurality of roofing shingles 12 is 60 inches.

In some embodiments, the length L2 of each of the plurality of photovoltaic shingles 18 is 10 inches to 60 inches. In some embodiments, the length L2 of each of the plurality of photovoltaic shingles 18 is in the same ranges as provided above for the length L1 of the roofing shingles 12.

In some embodiments, the width W1 of each of the plurality of roofing shingles 12 is in a range of 5 inches to 25 inches. In some embodiments, the width W1 of each of the plurality of roofing shingles 12 is in a range of 5 inches to 20 inches. In some embodiments, the width W1 of each of the plurality of roofing shingles 12 is in a range of 5 inches to 15 inches. In some embodiments, the width W1 of each of the plurality of roofing shingles 12 is in a range of 5 inches to 10 inches.

In some embodiments, the width W1 of each of the plurality of roofing shingles 12 is in a range of 10 inches to 25 inches. In some embodiments, the width W1 of each of the plurality of roofing shingles 12 is in a range of 10 inches to 20 inches. In some embodiments, the width W1 of each of the plurality of roofing shingles 12 is in a range of 10 inches to 15 inches.

In some embodiments, the width W1 of each of the plurality of roofing shingles 12 is in a range of 15 inches to 25 inches. In some embodiments, the width W1 of each of the plurality of roofing shingles 12 is in a range of 15 inches to 20 inches. In some embodiments, the width W1 of each of the plurality of roofing shingles 12 is in a range of 20 inches to 25 inches.

In some embodiments, the width W1 of each of the plurality of roofing shingles 12 is 5 inches. In some embodiments, the width W1 of each of the plurality of roofing shingles 12 is 10 inches. In some embodiments, the width W1 of each of the plurality of roofing shingles 12 is 15 inches. In some embodiments, the width W1 of each of the plurality of roofing shingles 12 is 20 inches. In some embodiments, the width W1 of each of the plurality of roofing shingles 12 is 25 inches.

Referring to FIGS. 3 through 5, in some embodiments, the roofing system 10 includes a plurality of photovoltaic shingles 18. In some embodiments, the plurality of photovoltaic shingles 18 is installed on the roof deck 14. In some embodiments, each of the plurality of photovoltaic shingles 18 includes a width W2, a length L2, a first edge 20, and a second edge 21 opposite the first edge 20. In some embodiments, the width W2 of each of the plurality of photovoltaic shingles 18 is equal to the width W1 of each of the plurality of roofing shingles 12. In some embodiments, the width W2 of each of the plurality of photovoltaic shingles 18 is substantially similar to the width W1 of each of the plurality of roofing shingles 12.

In some embodiments, each of the plurality of photovoltaic shingles 18 is composed of a polymer. In some embodiments, each of the plurality of photovoltaic shingles 18 includes thermoplastic polyolefin (TPO). In other embodiments, each of the plurality of photovoltaic shingles 18 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide; polyvinyl chloride (PVC); ethylene propylene diene monomer (EPDM) rubber; silicone rubber; fluoropolymers-ethylene tetrafluoroethylene (ETFE), polyvinylidene fluoride (PVDF), tetrafluoroethylene-hexafluoropropylene copolymers (FEP), and tetrafluoroethylene-hexafluoropropylene-vinylidene fluoride copolymers (THV), or blends thereof.

Referring to FIG. 4, in some embodiments, the first edge 20 of a first photovoltaic shingle 18a of the plurality of photovoltaic shingles 18 is juxtaposed with the first edge 16 of the roofing shingle 12a in a first row R1 of the plurality of rows R. In some embodiments, the first edge 20 of a second photovoltaic shingle 18b in a second row R2 of the plurality of rows R is offset from the first edge 20 of the first photovoltaic shingle 18a along the length L2 of the first photovoltaic shingle 18a.

In some embodiments, the first edge 20 of the second photovoltaic shingle 18b is offset from the first edge 20 of the first photovoltaic shingle 18a in a range of 5 inches to 40 inches. In some embodiments, the first edge 20 of the second photovoltaic shingle 18b is offset from the first edge 20 of the first photovoltaic shingle 18a in a range of 5 inches to 35 inches. In some embodiments, the first edge 20 of the second photovoltaic shingle 18b is offset from the first edge 20 of the first photovoltaic shingle 18a in a range of 5 inches to 30 inches. In some embodiments, the first edge 20 of the second photovoltaic shingle 18*b* is offset from the first edge 20 of the first photovoltaic shingle 18*a* in a range of 5 inches to 25 inches. In some embodiments, the first edge 20 of the second photovoltaic shingle 18*b* is offset from the first edge 20 of the first photovoltaic shingle 18*a* in a range of 5 inches to 20 inches. In some embodiments, the first edge 20 of the second photovoltaic shingle 18*b* is offset from the first edge 20 of the first photovoltaic shingle 18*a* in a range of 5 inches to 15 inches. In some embodiments, the first edge 20 of the second photovoltaic shingle 18*b* is offset from the first edge 20 of the first photovoltaic shingle 18*a* in a range of 5 inches to 10 inches.

In some embodiments, the first edge 20 of the second photovoltaic shingle 18*b* is offset from the first edge 20 of the first photovoltaic shingle 18*a* in a range of 10 inches to 40 inches. In some embodiments, the first edge 20 of the second photovoltaic shingle 18*b* is offset from the first edge 20 of the first photovoltaic shingle 18*a* in a range of 10 inches to 35 inches. In some embodiments, the first edge 20 of the second photovoltaic shingle 18*b* is offset from the first edge 20 of the first photovoltaic shingle 18*a* in a range of 10 inches to 30 inches. In some embodiments, the first edge 20 of the second photovoltaic shingle 18*b* is offset from the first edge 20 of the first photovoltaic shingle 18*a* in a range of 10 inches to 25 inches. In some embodiments, the first edge 20 of the second photovoltaic shingle 18*b* is offset from the first edge 20 of the first photovoltaic shingle 18*a* in a range of 10 inches to 20 inches. In some embodiments, the first edge 20 of the second photovoltaic shingle 18*b* is offset from the first edge 20 of the first photovoltaic shingle 18*a* in a range of 10 inches to 15 inches.

In some embodiments, the first edge 20 of the second photovoltaic shingle 18*b* is offset from the first edge 20 of the first photovoltaic shingle 18*a* in a range of 15 inches to 40 inches. In some embodiments, the first edge 20 of the second photovoltaic shingle 18*b* is offset from the first edge 20 of the first photovoltaic shingle 18*a* in a range of 15 inches to 35 inches. In some embodiments, the first edge 20 of the second photovoltaic shingle 18*b* is offset from the first edge 20 of the first photovoltaic shingle 18*a* in a range of 15 inches to 30 inches. In some embodiments, the first edge 20 of the second photovoltaic shingle 18*b* is offset from the first edge 20 of the first photovoltaic shingle 18*a* in a range of 15 inches to 25 inches. In some embodiments, the first edge 20 of the second photovoltaic shingle 18*b* is offset from the first edge 20 of the first photovoltaic shingle 18*a* in a range of 15 inches to 20 inches.

In some embodiments, the first edge 20 of the second photovoltaic shingle 18*b* is offset from the first edge 20 of the first photovoltaic shingle 18*a* in a range of 20 inches to 40 inches. In some embodiments, the first edge 20 of the second photovoltaic shingle 18*b* is offset from the first edge 20 of the first photovoltaic shingle 18*a* in a range of 20 inches to 35 inches. In some embodiments, the first edge 20 of the second photovoltaic shingle 18*b* is offset from the first edge 20 of the first photovoltaic shingle 18*a* in a range of 20 inches to 30 inches. In some embodiments, the first edge 20 of the second photovoltaic shingle 18*b* is offset from the first edge 20 of the first photovoltaic shingle 18*a* in a range of 20 inches to 25 inches.

In some embodiments, the first edge 20 of the second photovoltaic shingle 18*b* is offset from the first edge 20 of the first photovoltaic shingle 18*a* in a range of 25 inches to 40 inches. In some embodiments, the first edge 20 of the second photovoltaic shingle 18*b* is offset from the first edge 20 of the first photovoltaic shingle 18*a* in a range of 25 inches to 35 inches. In some embodiments, the first edge 20 of the second photovoltaic shingle 18*b* is offset from the first edge 20 of the first photovoltaic shingle 18*a* in a range of 25 inches to 30 inches.

In some embodiments, the first edge 20 of the second photovoltaic shingle 18*b* is offset from the first edge 20 of the first photovoltaic shingle 18*a* in a range of 30 inches to 40 inches. In some embodiments, the first edge 20 of the second photovoltaic shingle 18*b* is offset from the first edge 20 of the first photovoltaic shingle 18*a* in a range of 30 inches to 35 inches. In some embodiments, the first edge 20 of the second photovoltaic shingle 18*b* is offset from the first edge 20 of the first photovoltaic shingle 18*a* in a range of 35 inches to 40 inches.

In some embodiments, the first edge 20 of the second photovoltaic shingle 18*b* is offset from the first edge 20 of the first photovoltaic shingle 18*a* by 5 inches. In some embodiments, the first edge 20 of the second photovoltaic shingle 18*b* is offset from the first edge 20 of the first photovoltaic shingle 18*a* by 10 inches. In some embodiments, the first edge 20 of the second photovoltaic shingle 18*b* is offset from the first edge 20 of the first photovoltaic shingle 18*a* by 15 inches. In some embodiments, the first edge 20 of the second photovoltaic shingle 18*b* is offset from the first edge 20 of the first photovoltaic shingle 18*a* by 20 inches. In some embodiments, the first edge 20 of the second photovoltaic shingle 18*b* is offset from the first edge 20 of the first photovoltaic shingle 18*a* by 25 inches. In some embodiments, the first edge 20 of the second photovoltaic shingle 18*b* is offset from the first edge 20 of the first photovoltaic shingle 18*a* by 30 inches. In some embodiments, the first edge 20 of the second photovoltaic shingle 18*b* is offset from the first edge 20 of the first photovoltaic shingle 18*a* by 35 inches. In some embodiments, the first edge 20 of the second photovoltaic shingle 18*b* is offset from the first edge 20 of the first photovoltaic shingle 18*a* by 40 inches.

In some embodiments, the first edge 20 of at least one other photovoltaic shingle 18*c* of the plurality of photovoltaic shingles 18 in at least one first alternating row R3 from the first row R1 is substantially aligned with the first edge 20 of the first photovoltaic shingle 18*a*. In some embodiments, the first edge 20 of at least another photovoltaic shingle 18*d* of the plurality of photovoltaic shingles 18 in at least one second alternating row R4 from the second row R2 is substantially aligned with the first edge 20 of the second photovoltaic shingle 18*b*.

Still referring to FIG. 4, in some embodiments, the roofing system 10 includes a plurality of roofing shingles 22. In some embodiments, the plurality of roofing shingles 22 is installed on the roof deck 14. In some embodiments, each of the plurality of roofing shingles 22 includes a width W3. In some embodiments, the width W3 of each of the plurality of roofing shingles 22 is equal to the width W1 of each of the plurality of roofing shingles 12. In some embodiments, the width W3 of each of the plurality of roofing shingles 22 is substantially similar to the width W1 of each of the plurality of roofing shingles 12.

In some embodiments, each of the plurality of roofing shingles 22 is an asphalt shingle. In some embodiments, each of the plurality of roofing shingles 22 is composed of a polymer. In some embodiments, each of the plurality of photovoltaic shingles 22 includes thermoplastic polyolefin (TPO). In other embodiments, each of the plurality of photovoltaic shingles 22 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide; polyvinyl chloride (PVC); ethylene propylene diene monomer (EPDM) rubber; silicone rubber; fluoropolymers-ethylene tetrafluoroethylene (ETFE), poly vinylidene fluoride (PVDF), tetrafluoroethylene-hexafluoropropylene copolymers (FEP), and tetrafluoroethylene. In some embodiments, each of the plurality of roofing shingles 22 includes a structure similar to the plurality of roofing shingles 12.

In some embodiments, each of the plurality of roofing shingles 22 is adapted to be affixed to the roof deck 14 by the plurality of fasteners 15. In some embodiments, the plurality of fasteners 15 includes a plurality of nails. In some embodiments, the plurality of fasteners 15 includes a plurality of screws. In some embodiments, the plurality of fasteners 15 includes a plurality of staples. In some embodiments, the plurality of fasteners 15 includes a plurality of rivets. In some embodiments, each of the plurality of roofing shingles 22 is adapted to be affixed to the roof deck 14 by an adhesive.

Still referring to FIG. 4, in some embodiments, at least one roofing shingle 22b of the plurality of roofing shingles 22 is installed intermediate the roofing shingle 12b and the photovoltaic shingle 18b in the second row R2. In some embodiments, the at least one roofing shingle 22c of the plurality of roofing shingles 22 is installed intermediate a corresponding one roofing shingle 12c of the plurality of roofing shingles 12 and the photovoltaic shingle 18c in the at least one first alternating row R3. In some embodiments, at least one roofing shingle 22d of the plurality of roofing shingles 22 is installed intermediate a corresponding one roofing shingle 12d of the plurality of roofing shingles 12 and the photovoltaic shingle 18d in the at least one second alternating row R4.

In some embodiments, each of the plurality of roofing shingles 22 includes a total length L3 that is a multiple of one-half of the length L1. In some embodiments, the length L3 of each of the roofing shingles 22b, 22c is one-half the length L1. In some embodiments, the length L3 of the roofing shingle 22d is equal to the length L1. In some embodiments, the total length of the at least one of the plurality of roofing shingles 22 in each of every two rows of the plurality of rows R increases by a multiple of one. In some embodiments, the total length of the roofing shingles 22b and 22c is equal to the length L1. In some embodiments, the total length of the roofing shingle 22d is equal to the length L1. In some embodiments, the total length of the at least one of the plurality of roofing shingles 22 in each of every two rows of the plurality of rows R increases by a multiple of one and one-half.

Referring to FIG. 5, in some embodiments, the second edge 21 of a photovoltaic shingle 18f of the plurality of photovoltaic shingles 18 in the second row R2 is offset from the second edge 21 of the photovoltaic shingle 18e along the length L2 of the photovoltaic shingle 18e. In some embodiments, the second edge 21 of a photovoltaic shingle 18g of the plurality of photovoltaic shingles 18 in the at least one first alternating row R3 from the first row R1 is substantially aligned with the second edge 21 of the photovoltaic shingle 18e. In some embodiments, the second edge 21 of at least another photovoltaic shingle 18h of the plurality of photovoltaic shingles 18 in the at least one second alternating row R4 from the second row R2 is substantially aligned with the second edge 21 of the photovoltaic shingle 18f.

Still referring to FIG. 5, in some embodiments, at least one roofing shingle 22e of the plurality of roofing shingles 22 is installed intermediate a roofing shingle 12e of the plurality of roofing shingles 12 and the photovoltaic shingle 18e in the first row R1. In some embodiments, at least one roofing shingle 22f of the plurality of roofing shingles 22 is installed intermediate a roofing shingle 12f of the plurality of roofing shingles 12 and the photovoltaic shingle 18f in the second row R2. In some embodiments, at least one roofing shingle 22g of the plurality of roofing shingles 22 is installed intermediate a corresponding one roofing shingle 12g of the plurality of roofing shingles 12 and the photovoltaic shingle 18g in the at least one first alternating row R3. In some embodiments, the second edge 21 of the photovoltaic shingle 18h is juxtaposed with the second edge 17 of the roofing shingle 12h in the fourth row R4.

In some embodiments, the length L3 of each of the roofing shingles 22f, 22g is one-half the length L1. In some embodiments, the length L3 of the roofing shingle 22e is equal to the length L1. In some embodiments, the total length of the at least one of the plurality of roofing shingles 22 in each of every two rows of the plurality of rows R increases by a multiple of one. In some embodiments, the total length of the roofing shingles 22f and 22g is equal to the length L1. In some embodiments, the total length of the roofing shingle 22e is equal to the length L1. In some embodiments, the total length of the at least one of the plurality of roofing shingles 22 in each of every two rows of the plurality of rows R increases by a multiple of one and one-half.

Figure 6:
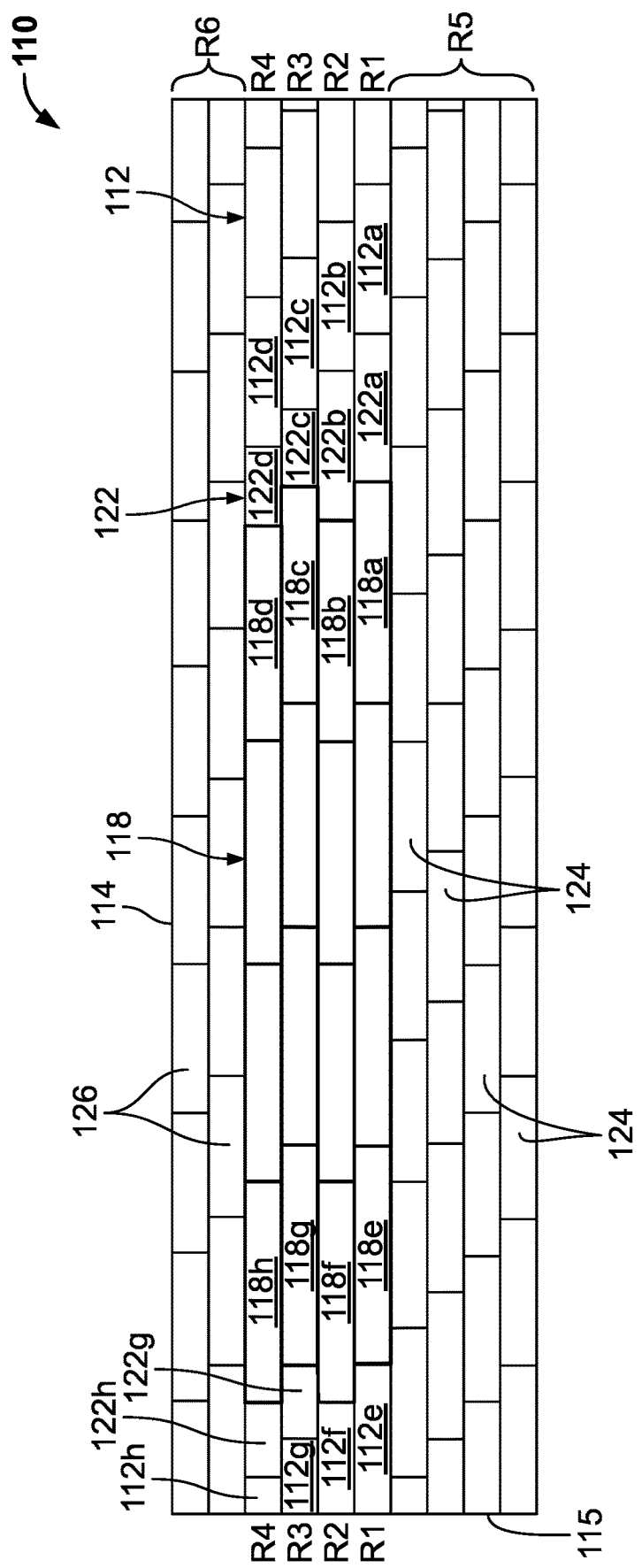
FIG. 6 is a top elevational view of a plurality of booked roofing shingles and an array of a plurality of offset photovoltaic shingles.

Referring to FIG. 6, in some embodiments, a roofing system 110 includes a plurality of roofing shingles 112 including roofing shingles 112a, 112b, 112c, 112d, a plurality of photovoltaic shingles 118 including photovoltaic shingles 118a, 118b, 118c, 118d, and a plurality of roofing shingles 122 including roofing shingles 122a, 122b, 122c, 122d, each of which is installed within corresponding rows R1, R2, R3 and R4 on a roof deck 114. In some embodiments, the roofing shingles 112 are installed in a stair-step (i.e., booked) arrangement. In some embodiments, the photovoltaic shingles 118 are arranged in an offset pattern. In some embodiments, the roofing shingle 122a is installed intermediate the photovoltaic shingle 118a and the roofing shingle 112a. In some embodiments, the roofing shingle 122b is installed intermediate the photovoltaic shingle 118b and the roofing shingle 112b. In some embodiments, the roofing shingle 122c is installed intermediate the photovoltaic shingle 118c and the roofing shingle 112c. In some embodiments, the roofing shingle 122d is installed intermediate the photovoltaic shingle 118d and the roofing shingle 112d.

In some embodiments, the length of the roofing shingle 122h is equal to the length of the roofing shingle 112h. In some embodiments, the length of the roofing shingle 122h is equal to the length of the roofing shingle 112b. In some embodiments, the length of the roofing shingle 122c is one-half the length of the roofing shingle 112c. In some embodiments, the length of the roofing shingle 122d is one-half the length of the roofing shingle 112d.

Still referring to FIG. 6, in some embodiments, the plurality of roofing shingles 112 includes roofing shingles 112e, 112f, 112g, 112h, the plurality of photovoltaic shingles 118 includes photovoltaic shingles 118e, 118f, 118g, 118h, and the plurality of roofing shingles 122 includes roofing shingles 122g, 122h, each of which is installed within the corresponding rows R1, R2, R3 and R4 on the roof deck 114 proximate to an edge 115 thereof.

In some embodiments, the roofing shingle 112e is installed adjacent to the photovoltaic shingle 118e. In some embodiments, the roofing shingle 112f is installed adjacent to the photovoltaic shingle 118f. In some embodiments, the roofing shingle 112f is three-quarters the length of one of the roofing shingles 112. In some embodiments, the roofing shingle 122g is installed intermediate the photovoltaic shingle 118g and the roofing shingle 112g. In some embodiments, the roofing shingle 112g is one-half the length of one of the plurality of roofing shingles 112. In some embodiments, the roofing shingle 122g is one-half the length of one of the plurality of roofing shingles 112.

In some embodiments, the roofing shingle 122g is installed intermediate the photovoltaic shingle 118g and the roofing shingle 112g. In some embodiments, the roofing shingle 112h is one-quarter the length of one of the plurality of roofing shingles 112. In some embodiments, the length of the roofing shingle 122h is one-half the length of one of the plurality of roofing shingles 112. In some embodiments, the booked arrangement of the roofing shingles 112 is optimized.

Still referring to FIG. 6, in some embodiments, a plurality of roofing shingles 124 is installed on the roof deck 114. In some embodiments, the roofing shingles 124 are installed in a plurality of rows R5. In some embodiments, the roofing shingles 124 are installed in a stair-step (i.e., booked) arrangement. In some embodiments, the roofing shingles 124 are installed prior to the installation of the photovoltaic shingles 118. In some embodiments, the roofing shingles 124 are installed on the roof deck 114 and below the photovoltaic shingles 118. In some embodiments, the roofing shingles 124 are installed on the roof deck 114 below the photovoltaic shingles 118 located in a bottom row, for example, row R1. In some embodiments, the roofing shingles 124 are installed on the roof deck 114 in one or more of the rows R5 that are below row R1.

Still referring to FIG. 6, in some embodiments, a plurality of roofing shingles 126 is installed on the roof deck 114. In some embodiments, the roofing shingles 126 are installed in a plurality of rows R6. In some embodiments, the roofing shingles 126 are installed in a stair-step (i.e., booked) arrangement. In some embodiments, the roofing shingles 126 are installed after the installation of the photovoltaic shingles 118. In some embodiments, the roofing shingles 126 are installed on the roof deck 114 and above the photovoltaic shingles 118. In some embodiments, the roofing shingles 126 are installed on the roof deck 114 above the photovoltaic shingles 118 located in a top row, for example, row R4. In some embodiments, the roofing shingles 126 are installed on the roof deck 114 in one or more of the rows R6 that are above row R4.

Figure 7:
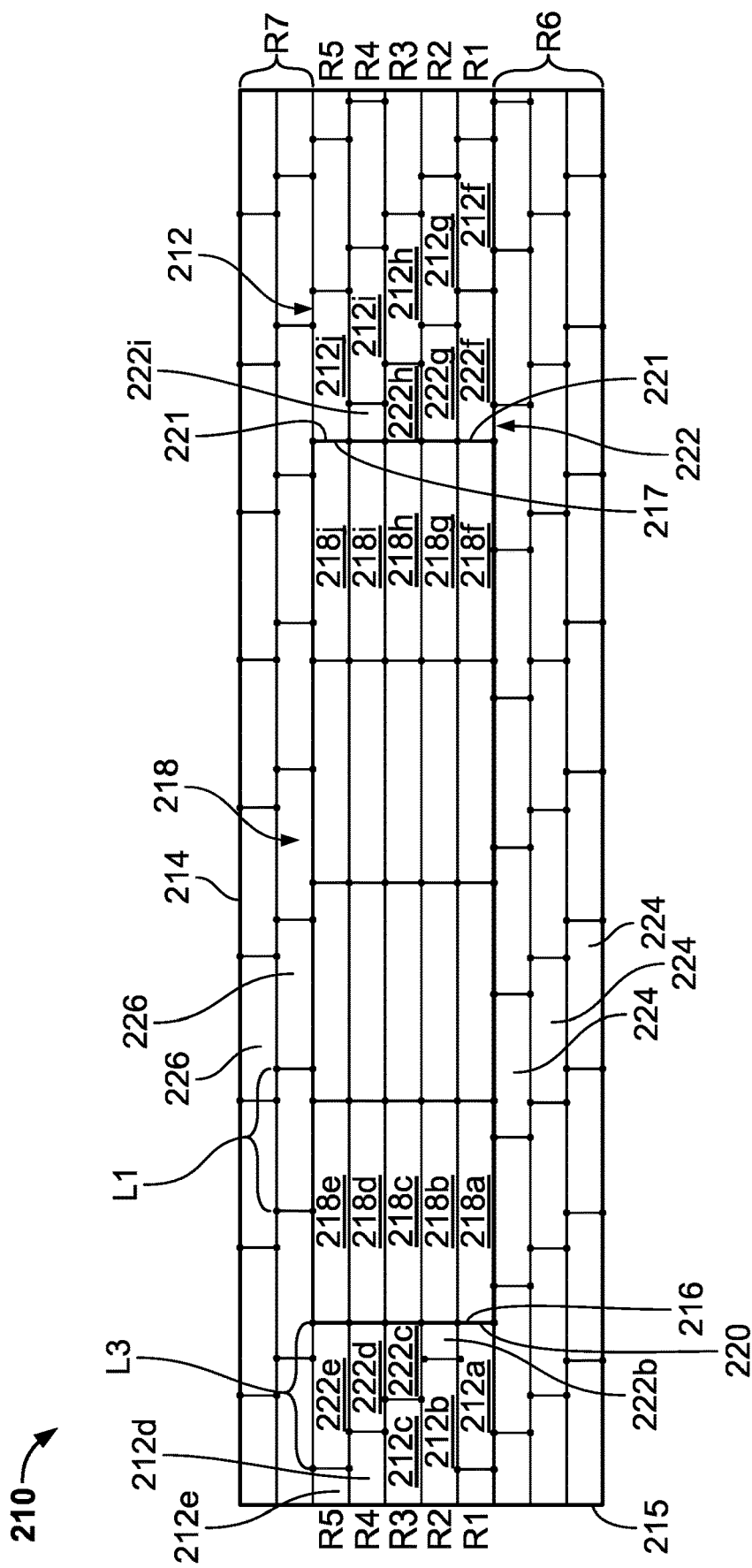
FIG. 7 is a top elevational view of some embodiments of a plurality of booked roofing shingles and an array of a plurality of aligned photovoltaic shingles.

Referring to FIG. 7, in another embodiment, a roofing system 210 includes a plurality of roofing shingles 212 including roofing shingles 212a, 212b, 212c, 212d, 212e, a plurality of photovoltaic shingles 218 including photovoltaic shingles 218a, 218b, 218c, 218d, 218e and a plurality of roofing shingles 222 including roofing shingles 222b, 222c, 222d, 222e, each of which is installed within corresponding rows R1, R2, R3, R4 and R5 on a roof deck 214 proximate to an edge 215 thereof. In some embodiments, the roofing shingles 212 are installed in a stair-step (i.e., book) arrangement. In some embodiments, the photovoltaic shingles 218 are arranged in an aligned array. In some embodiments, each of first edges 220 of each of the photovoltaic shingles 218a, 218b, 218c, 218d, 218e is substantially aligned with one another. In some embodiments, the first edge 220 of at least one of the plurality of photovoltaic shingles 218 is substantially aligned with the first edge 220 of at least another one of the plurality of photovoltaic shingles 218.

In some embodiments, the first edge 220 of the photovoltaic shingle 218a of the plurality of photovoltaic shingles 218 is juxtaposed with the first edge 216 of a first roofing shingle 212a of the plurality of roofing shingles 212 in the first row R1. In some embodiments, at least one of the plurality of roofing shingles 222 is installed intermediate a corresponding one of the plurality of roofing shingles 212 and one of the plurality of photovoltaic shingles 218 in each of the at least one of another of the plurality of rows R.

In some embodiments, each of the plurality of roofing shingles 222 includes a length L3 that is a multiple of one-quarter of the length L1 of each of the plurality of roofing shingles 212. In some embodiments, each of the plurality of roofing shingles 222 includes a length L3 that is a multiple of one-half of the length L1. In some embodiments, each of the plurality of roofing shingles 222 includes a length L3 that is a multiple of three-quarters of the length L1. In some embodiments, each of the plurality of roofing shingles 222 includes a length L3 that is a multiple of one of the length L1. In some embodiments, the total length of the at least one of the plurality of roofing shingles 222 in each row of the plurality of rows R increases by a multiple of one. In some embodiments, the total length of the at least one of the plurality of roofing shingles 222 in each of every two rows of the plurality of rows R increases by a multiple of one and one-half.

In some embodiments, the roofing shingle 222b is installed intermediate the photovoltaic shingle 218b and the roofing shingle 212b in the second row R2. In some embodiments, the length L3 of the roofing shingle 222b is one-quarter the length L1 of one of the plurality of roofing shingles 112.

In some embodiments, the roofing shingle 222c is installed intermediate the photovoltaic shingle 218c and the roofing shingle 212c in the third row R3. In some embodiments, the length L3 of the roofing shingle 222c is one-half the length L1 of one of the plurality of roofing shingles 212.

In some embodiments, the roofing shingle 222d is installed intermediate the photovoltaic shingle 218d and the roofing shingle 212d in the fourth row R4. In some embodiments, the length L3 of the roofing shingle 222d is three-quarters of the length L1 of one of the plurality of roofing shingles 212.

In some embodiments, the roofing shingle 222e is installed intermediate the photovoltaic shingle 218e and the roofing shingle 212e in the fifth row R5. In some embodiments, the length L3 of the roofing shingle 122h is equal to the length L1 of one of the plurality of roofing shingles 212. In some embodiments, the booked arrangement of the roofing shingles 212 is optimized.

Still referring to FIG. 7, in some embodiments, the plurality of roofing shingles 212 includes roofing shingles 212f, 212g, 212h, 212i, 212j, the plurality of photovoltaic shingles 218 includes photovoltaic shingles 218f, 218g, 218h, 2181, 218j, and the plurality of roofing shingles 222 includes roofing shingles 222f, 222g, 222h, 222i, each of which is installed within corresponding rows R1, R2, R3, R4 and R5 on the roof deck 214. In some embodiments, each of second edges 221 of each of the photovoltaic shingles 218f, 218g, 218h, 2181, 218j is substantially aligned with one another.

In some embodiments, the roofing shingle 222f is installed intermediate the photovoltaic shingle 218f and the roofing shingle 212f in the first row R1. In some embodiments, the length L3 of the roofing shingle 222f is equal to the length L1 of one of the plurality of roofing shingles 212.

In some embodiments, the roofing shingle 222g is installed intermediate the photovoltaic shingle 218g and the roofing shingle 212g in the second row R2. In some embodiments, the length L3 of the roofing shingle 222g is three-quarters the length L1.

In some embodiments, the roofing shingle 222h is installed intermediate the photovoltaic shingle 218h and the roofing shingle 212h in the third row R3. In some embodiments, the length L3 of the roofing shingle 222h is one-half of the length L1.

In some embodiments, the roofing shingle 222i is installed intermediate the photovoltaic shingle 218i and the roofing shingle 212i in the fourth row R4. In some embodiments, the length L3 of the roofing shingle 222i is one-quarter the length.

In some embodiments, the second edge 221 of the photovoltaic shingle 218j is juxtaposed with the second edge 217 of the roofing shingle 212j in the fifth row R5.

Still referring to FIG. 7, in some embodiments, a plurality of roofing shingles 224 is installed on the roof deck 214. In some embodiments, the roofing shingles 224 are installed in a plurality of rows R6. In some embodiments, the roofing shingles 224 are installed in a stair-step (i.e., booked) arrangement. In some embodiments, the roofing shingles 224 are installed prior to the installation of the photovoltaic shingles 218. In some embodiments, the roofing shingles 224 are installed on the roof deck 214 and below the photovoltaic shingles 218. In some embodiments, the roofing shingles 224 are installed on the roof deck 214 below the photovoltaic shingles 218 located in a bottom row, for example, row R1. In some embodiments, the roofing shingles 224 are installed on the roof deck 214 in one or more of the rows R6 that are below row R1.

Still referring to FIG. 7, in some embodiments, a plurality of roofing shingles 226 is installed on the roof deck 214. In some embodiments, the roofing shingles 226 are installed in a plurality of rows R7. In some embodiments, the roofing shingles 226 are installed in a stair-step (i.e., booked) arrangement. In some embodiments, the roofing shingles 226 are installed after the installation of the photovoltaic shingles 218. In some embodiments, the roofing shingles 226 are installed on the roof deck 214 and above the photovoltaic shingles 218. In some embodiments, the roofing shingles 226 are installed on the roof deck 214 above the photovoltaic shingles 218 located in a top row, for example, row R5. In some embodiments, the roofing shingles 226 are installed on the roof deck 214 in one or more of the rows R7 that are above row R4.

In some embodiments, the first edge 216 of one of the roofing shingles 212 in each of the plurality of rows R1-R5 is offset from the first edge 216 of another one of the plurality of roofing shingles 212 in another adjacent one of the plurality of rows R1-R5 in a direction along the first length of the another one of the plurality of roofing shingles 212. In some embodiments, the offset in each row is a whole number multiple of the length L1 of the roofing shingle 212 divided by an integer (e.g., 1, 2, 3, 4, 5, 6, 7, 8, 9, 10, 11, 12, 13, 14, 15, 16, 17, 18, 19, 20), the integer being selected as the number of rows for which the offset pattern repeats:

Offset=whole number multiple of L1/integer(e.g., 1,2,3,4,5, etc.)

FIGS. 8 through 11 show embodiments of non-limiting examples of booked patterns of the roofing shingles 212 and the photovoltaic shingles 218 on the roof deck 114.

Example 1

Figure 8:
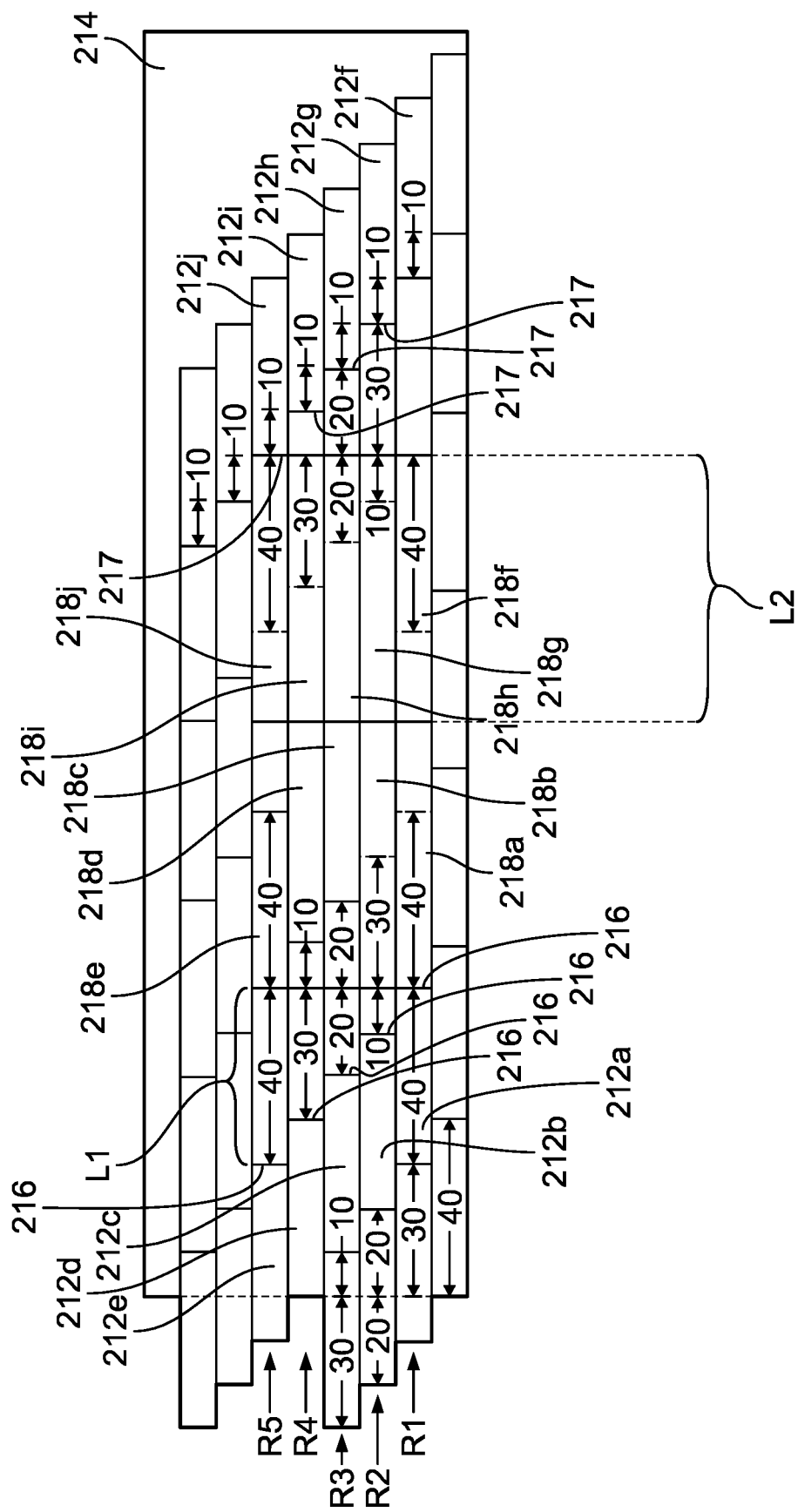
FIGS. 8 through 11 are top elevational views of some embodiments of a plurality of booked roofing shingles and an array of a plurality of aligned photovoltaic shingles.

Referring to FIG. 8, in some embodiments, the plurality of photovoltaic shingles 218 includes the photovoltaic shingles 218a-218e installed on the roof deck 214 in a first array in rows R1-R5 and the photovoltaic shingles 218f-212j installed on the roof deck 214 in a second array in rows R1-R5. In some embodiments, the plurality of roofing shingles 212 includes the roofing shingles 212a-212e installed on the roof deck 214 on one side of the first array and the roofing shingles 212f-212j installed on the roof deck 214 on an opposite side of the second array. In some embodiments, the length L2 of each of the photovoltaic shingles 218a-212j is 60 inches. In some embodiments, the length L1 of each of the roofing shingles 212a-212j is 40 inches. In some embodiments, an offset of 10 inches is calculated by dividing the length L1 of 40 inches by four. In some embodiments, the offset pattern will repeat itself every four rows. In some embodiments, the edge 216 of the roofing shingle 212a is juxtaposed with the photovoltaic shingle 218a in row R1. In some embodiments, the edge 216 of the roofing shingle 212b in row R2 is offset 10 inches from the edge 216 of the roofing shingle 212a in row R1 and 10 inches from the photovoltaic shingle 218b in row R2. In some embodiments, the edge 216 of the roofing shingle 212c in row R3 is offset 10 inches from the edge 216 of the roofing shingle 212b in row R2 and 20 inches from the photovoltaic shingle 218c in row R3. In some embodiments, the edge 216 of the roofing shingle 212d in row R4 is offset 10 inches from the edge 216 of the roofing shingle 212c in row R3 and 30 inches from the photovoltaic shingle 218d in row R4. In some embodiments, the edge 216 of the roofing shingle 212e in row R5 is offset 10 inches from the edge 216 of the roofing shingle 212d in row R4 and 40 inches from the photovoltaic shingle 218d in row R4.

In some embodiments, an opposite offset pattern applies on the opposite side with respect to the photovoltaic shingles 218f-218j and the roofing shingles 212f-212j. In some embodiments, the edge 217 of the roofing shingle 212j is juxtaposed with the photovoltaic shingle 218j in row R5. In some embodiments, the edge 217 of the roofing shingle 212i in row R4 is offset 10 inches from the edge 217 of the roofing shingle 212j in row R5 and 10 inches from the photovoltaic shingle 218i in row R4. In some embodiments, the edge 217 of the roofing shingle 212h in row R3 is offset 10 inches from the edge 217 of the roofing shingle 212i in row R4 and 20 inches from the photovoltaic shingle 218h in row R3. In some embodiments, the edge 217 of the roofing shingle 212g in row R2 is offset 10 inches from the edge 217 of the roofing shingle 212h in row R3 and 30 inches from the photovoltaic shingle 218g in row R2. In some embodiments, the edge 217 of the roofing shingle 212f in row R1 is offset 10 inches from the edge 217 of the roofing shingle 212g in row R2 and 40 inches from the photovoltaic shingle 218f in row R1.

Example 2

Figure 9:
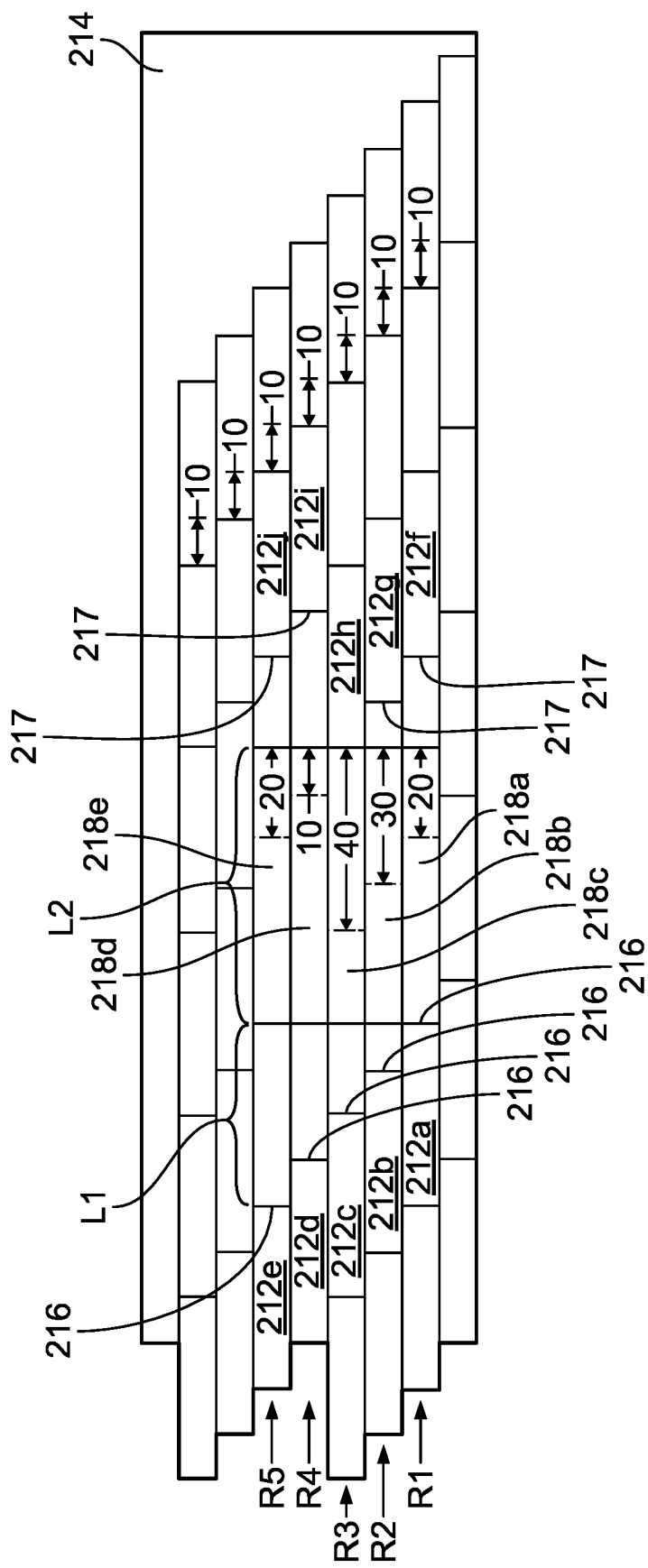

Referring to FIG. 9, in some embodiments, the plurality of photovoltaic shingles 218 includes one array the photovoltaic shingles 218a-218e installed on the roof deck 214 in rows R1-R5. In some embodiments, the plurality of roofing shingles 212 includes the roofing shingles 212a-212e installed on the roof deck 214 on one side of the array and the roofing shingles 212f-212j installed on the roof deck 214 on an opposite side of the array. In some embodiments, the length L2 of each of the photovoltaic shingles 218a-212e is 60 inches. In some embodiments, the length L1 of each of the roofing shingles 212a-212j is 40 inches. In some embodiments, an offset of 10 inches is calculated by dividing the length L1 of 40 inches by four. In some embodiments, the offset pattern will repeat itself every four rows. In some embodiments, the edge 216 of the roofing shingle 212a is juxtaposed with the photovoltaic shingle 218a in row R1. In some embodiments, the edge 216 of the roofing shingle 212b in row R2 is offset 10 inches from the edge 216 of the roofing shingle 212a in row R1 and 10 inches from the photovoltaic shingle 218b in row R2. In some embodiments, the edge 216 of the roofing shingle 212c in row R3 is offset 10 inches from the edge 216 of the roofing shingle 212b in row R2 and 20 inches from the photovoltaic shingle 218c in row R3. In some embodiments, the edge 216 of the roofing shingle 212d in row R4 is offset 10 inches from the edge 216 of the roofing shingle 212c in row R3 and 30 inches from the photovoltaic shingle 218d in row R4. In some embodiments, the edge 216 of the roofing shingle 212e in row R5 is offset 10 inches from the edge 216 of the roofing shingle 212d in row R4 and 40 inches from the photovoltaic shingle 218e in row R5.

In some embodiments, the offset pattern on the opposite side of the photovoltaic shingles 212a-212e is different, as a result of the overall booking pattern of the roofing shingles 212 on the roof deck 214 originating thereon. In some embodiments, the edge 217 of the roofing shingle 212j in row R5 is offset 20 inches from the photovoltaic shingle 218e in row R5. In some embodiments, the edge 217 of the roofing shingle 212i in row R4 is offset 10 inches from the edge 217 of the roofing shingle 212j in row R5 and 30 inches from the photovoltaic shingle 218d in row R4. In some embodiments, the edge 217 of the roofing shingle 212h in row R3 is juxtaposed with the photovoltaic shingle 218c in row R3. In some embodiments, the edge 217 of the roofing shingle 212g in row R2 is offset 10 inches from the edge 217 of the roofing shingle 212h in row R3 and 10 inches from the photovoltaic shingle 218b in row R2. In some embodiments, the edge 217 of the roofing shingle 212f in row R1 is offset 10 inches from the edge 217 of the roofing shingle 212g in row R2 and 20 inches from the photovoltaic shingle 218a in row R1.

Example 3

Figure 10:
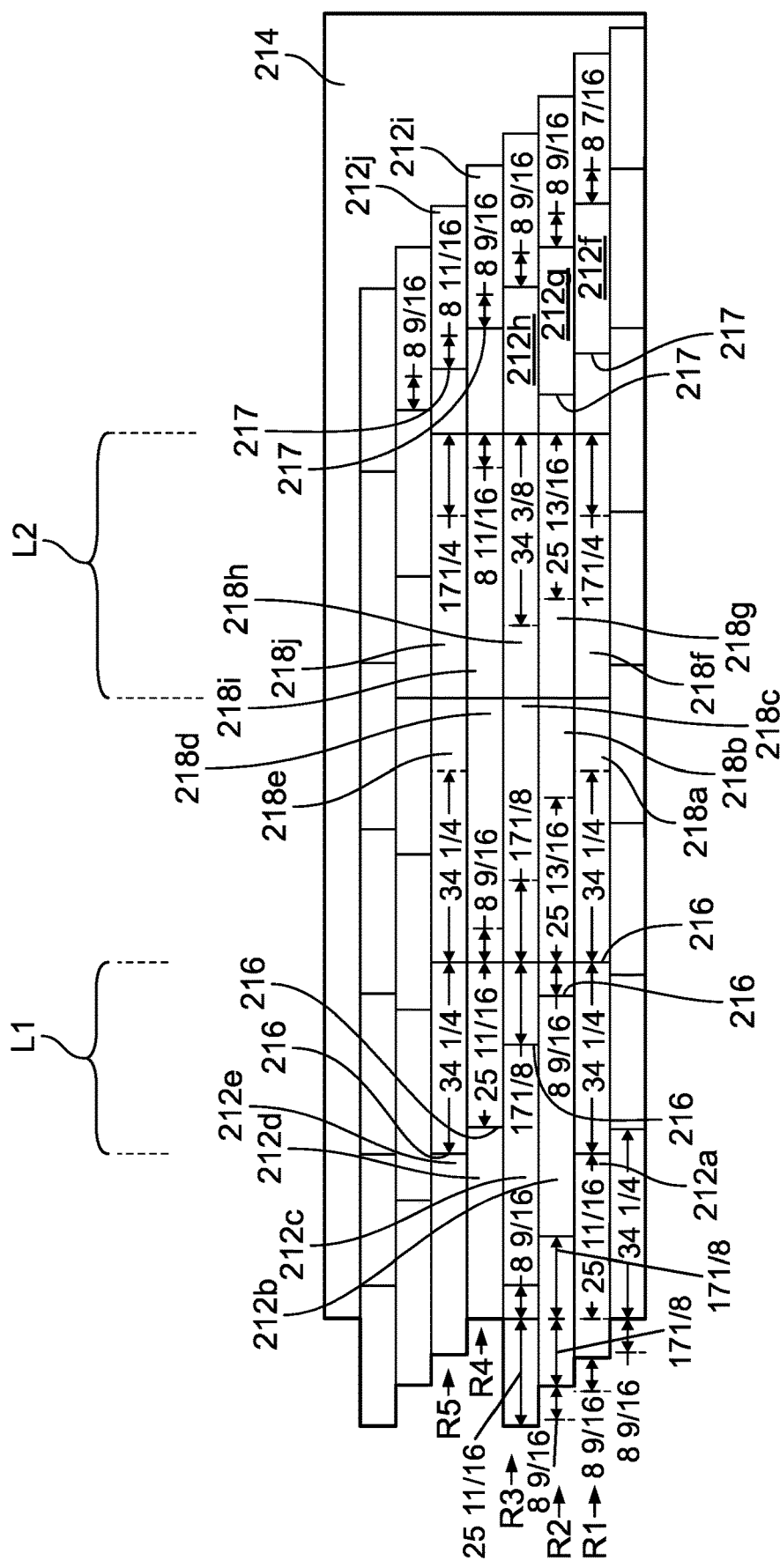

Referring to FIG. 10, in some embodiments, the plurality of photovoltaic shingles 218 includes the photovoltaic shingles 218a-218e installed on the roof deck 214 in a first array and the photovoltaic shingles 218f-212j installed on the roof deck 214 in a second array in rows R1-R5. In some embodiments, the plurality of roofing shingles 212 includes the roofing shingles 212a-212e installed on the roof deck 214 on one side of the first array and the roofing shingles 212f-212j installed on the roof deck 214 on an opposite side of the second array. In some embodiments, the length L2 of each of the photovoltaic shingles 218a-212j is 60 inches. In some embodiments, the length L1 of each of the roofing shingles 212a-212j is 34-¼ (34.25) inches. In some embodiments, an offset of 8-9/16 (8.5625) inches is calculated by dividing the length L1 of 34-¼ inches by four. In some embodiments, the offset pattern will repeat itself every four rows. In some embodiments, the edge 216 of the roofing shingle 212a is juxtaposed with the photovoltaic shingle 218a in row R1. In some embodiments, the edge 216 of the roofing shingle 212b in row R2 is offset 8 9/16 inches from the edge 216 of the roofing shingle 212a in row R1 and 8-9/16 inches from the photovoltaic shingle 218b in row R2. In some embodiments, the edge 216 of the roofing shingle 212c in row R3 is offset 8-9/16 inches from the edge 216 of the roofing shingle 212b in row R2 and 17-⅛ inches from the photovoltaic shingle 218c in row R3. In some embodiments, the edge 216 of the roofing shingle 212d in row R4 is offset 8-9/16 inches from the edge 216 of the roofing shingle 212c in row R3 and 25-11/16 inches from the photovoltaic shingle 218d in row R4. In some embodiments, the edge 216 of the roofing shingle 212e in row R5 is offset 8-9/16 inches from the edge 216 of the roofing shingle 212d in row R4 and 34-¼ inches from the photovoltaic shingle 218e in row R5.

In some embodiments, the offset pattern on the opposite side of the photovoltaic shingles 212f-212j is different, as a result of the overall booking pattern of the roofing shingles 212 on the roof deck 214 originating thereon. In some embodiments, the edge 217 of the roofing shingle 212j in row R5 is offset 17-⅛ inches from the photovoltaic shingle 218j in row R5. In some embodiments, the edge 217 of the roofing shingle 212i in row R4 is offset 8-9/16 inches from the edge 217 of the roofing shingle 212j in row R5 and 25-11/16 inches from the photovoltaic shingle 218i in row R4. In some embodiments, the edge 217 of the roofing shingle 212h in row R3 is juxtaposed with the photovoltaic shingle 218h in row R3. In some embodiments, the edge 217 of the roofing shingle 212g in row R2 is offset 8-9/16 inches from the edge 217 of the roofing shingle 212h in row R3 and 8-9/16 inches from the photovoltaic shingle 218g in row R2. In some embodiments, the edge 217 of the roofing shingle 212f in row R1 is offset 8-9/16 inches from the edge 217 of the roofing shingle 212g in row R2 and 17-⅛ inches from the photovoltaic shingle 218f in row R1.

Example 4

Figure 11:
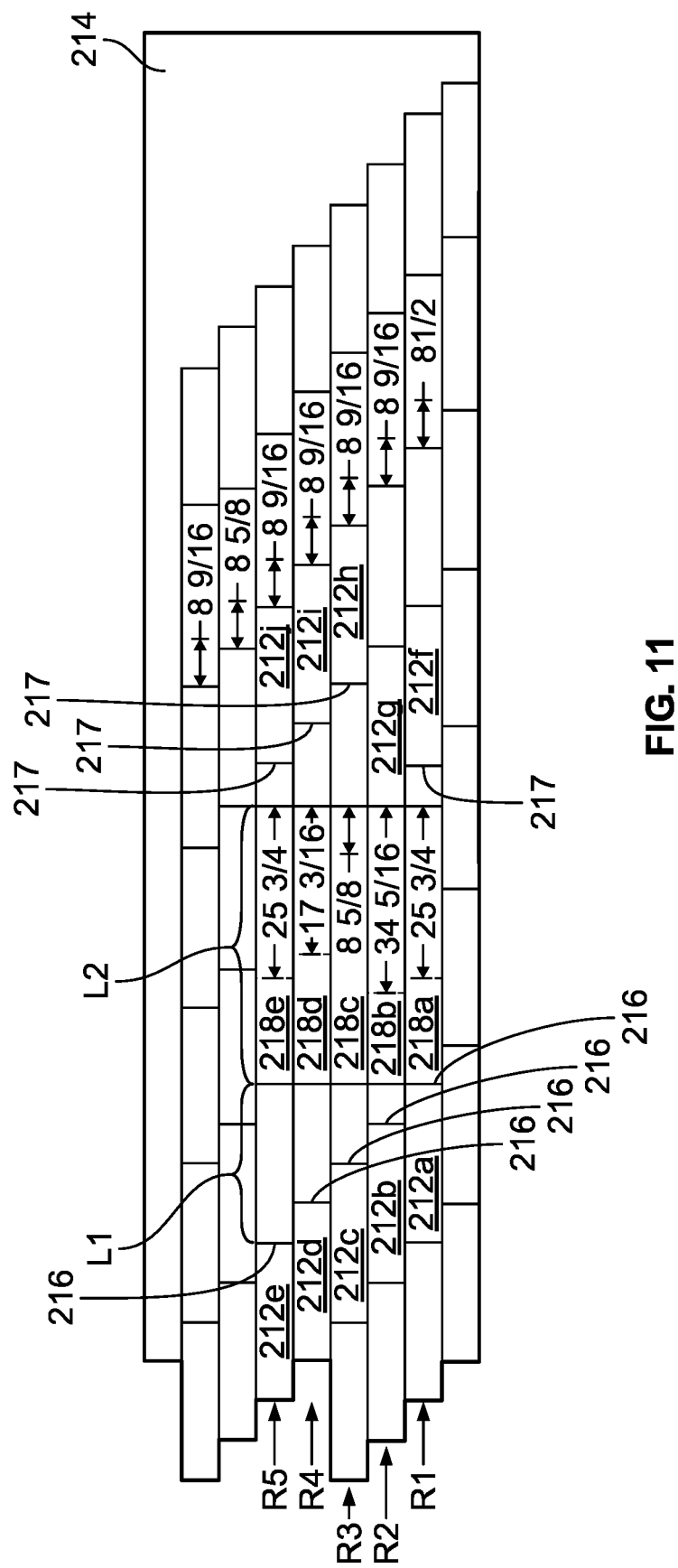

Referring to FIG. 11, in some embodiments, the plurality of photovoltaic shingles 218 includes an array of the photovoltaic shingles 218a-218e installed on the roof deck 214 in rows R1-R5. In some embodiments, the plurality of roofing shingles 212 includes the roofing shingles 212a-212e installed on the roof deck 214 on one side of the array and the roofing shingles 212f-212j installed on the roof deck 214 on an opposite side of the array. In some embodiments, the length L2 of each of the photovoltaic shingles 218a-212e is 60 inches. In some embodiments, the length L1 of each of the roofing shingles 212a-212j is 34-¼ (34.5625) inches. In some embodiments, an offset of 8-9/16 inches is calculated by dividing the length L1 of 34-¼ inches by four. In some embodiments, the offset pattern will repeat itself every four rows. In some embodiments, the edge 216 of the roofing shingle 212a is juxtaposed with the photovoltaic shingle 218a in row R1. In some embodiments, the edge 216 of the roofing shingle 212b in row R2 is offset 8-9/16 inches from the edge 216 of the roofing shingle 212a in row R1 and 8-9/16 inches from the photovoltaic shingle 218b in row R2. In some embodiments, the edge 216 of the roofing shingle 212c in row R3 is offset 8-9/16 inches from the edge 216 of the roofing shingle 212b in row R2 and 17-⅛ inches from the photovoltaic shingle 218c in row R3. In some embodiments, the edge 216 of the roofing shingle 212d in row R4 is offset 8-9/16 inches from the edge 216 of the roofing shingle 212c in row R3 and 25-11/16 inches from the photovoltaic shingle 218d in row R4. In some embodiments, the edge 216 of the roofing shingle 212e in row R5 is offset 8-9/16 inches from the edge 216 of the roofing shingle 212d in row R4 and 34-¼ inches from the photovoltaic shingle 218e in row R5.

In some embodiments, the offset pattern on the opposite side of the photovoltaic shingles 212a-212e is different, as a result of the overall booking pattern of the roofing shingles 212 on the roof deck 214 originating thereon. In some embodiments, the edge 217 of the roofing shingle 212j in row R5 is offset 8-9/16 inches from the photovoltaic shingle 218e in row R5. In some embodiments, the edge 217 of the roofing shingle 212i in row R4 is offset 8-9/16 inches from the edge 217 of the roofing shingle 212j in row R5 and 17-1/8 inches from the photovoltaic shingle 218d in row R4. In some embodiments, the edge 217 of the roofing shingle 212h in row R3 is offset 8-9/16 inches from the edge 217 of the roofing shingle 212i in row R4 and 25-11/16 inches from the photovoltaic shingle 218c in row R3. In some embodiments, the edge 217 of the roofing shingle 212g in row R2 is juxtaposed with the photovoltaic shingle 218b in row R2. In some embodiments, the edge 217 of the roofing shingle 212f in row R1 is offset 8-9/16 inches from the edge 217 of the roofing shingle 212g in row R2 and 8-9/16 inches from the photovoltaic shingle 218a in row R1.

In some embodiments, a method includes the steps of:
installing a first plurality of roofing shingles in on a roof deck;
installing a plurality of photovoltaic shingles in a second plurality of rows on the roof deck, each of the plurality of photovoltaic shingles including a first edge and a length. In some embodiments, the second plurality of rows is located above the first plurality of rows;
installing a second plurality of roofing shingles in the second plurality of rows on the roof deck, each of the second plurality of roofing shingles including a first length and a first edge, and the first edge of one of the second plurality of roofing shingles in each of the second plurality of rows is offset from the first edge of another one of the second plurality of roofing shingles in another adjacent one of the second plurality of rows in a direction along the first length of the another one of the second plurality of roofing shingles, the first edge of a first photovoltaic shingle of the plurality of photovoltaic shingles being juxtaposed with the first edge of a second roofing shingle of the second plurality of roofing shingles in a first row of the second plurality of rows, the first edge of a second photovoltaic shingle of the plurality of photovoltaic shingles in a second row of the second plurality of rows being offset from the first edge of the first photovoltaic shingle along the length of the first photovoltaic shingle, the first edge of at least one other of the plurality of photovoltaic shingles in at least one first alternating row from the first row being substantially aligned with the first edge of the first photovoltaic shingle, and the first edge of at least another one of the plurality of photovoltaic shingles in at least one second alternating row from the second row being substantially aligned with the first edge of the second photovoltaic shingle;
installing a third plurality of roofing shingles on the roof deck, at least one of the third plurality of roofing shingles being installed intermediate a corresponding one of the second plurality of roofing shingles and one of the plurality of photovoltaic shingles in each of the second row, the at least one first alternating row and the at least one second alternating row; and
installing a fourth plurality of roofing shingles in a third plurality of rows on the roof deck. In some embodiments, the third plurality of rows is located above the second plurality of rows.

In some embodiments, a method includes the steps of:
installing a first plurality of roofing shingles in on a roof deck;
installing a plurality of photovoltaic shingles in a second plurality of rows on the roof deck, each of the plurality of photovoltaic shingles including a first edge and a length. In some embodiments, the second plurality of rows is located above the first plurality of rows;
installing a second plurality of roofing shingles in the second plurality of rows on the roof deck, each of the second plurality of roofing shingles including a first length and a first edge, the first edge of one of the second plurality of roofing shingles in each of the second plurality of rows being offset from the first edge of another one of the second plurality of roofing shingles in another adjacent one of the second plurality of rows in a direction along the first length of the another one of the second plurality of roofing shingles, the first edge of a first photovoltaic shingle of the plurality of photovoltaic shingles being juxtaposed with the first edge of a first roofing shingle of the second plurality of roofing shingles in a first row of the second plurality of rows, the first edge of at least one of another of the plurality of photovoltaic shingles in at least one of another row of the second plurality of rows is substantially aligned with the first edge of the first photovoltaic shingle;
installing a third plurality of roofing shingles on the roof deck, at least one of the third plurality of roofing shingles being installed intermediate a corresponding one of the second plurality of roofing shingles and one of the plurality of photovoltaic shingles in each of the at least one of another of the second plurality of rows; and
installing a fourth plurality of roofing shingles in a third plurality of rows on the roof deck. In some embodiments, the third plurality of rows is located above the second plurality of rows.

Figure 12:
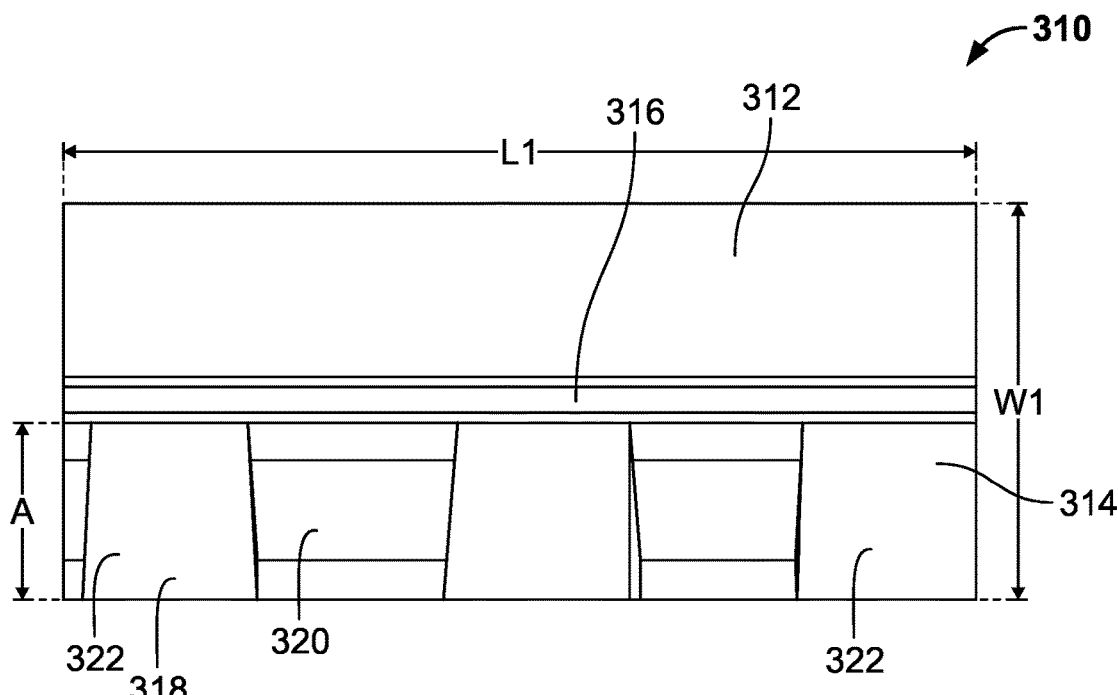
FIGS. 12 and 13 are a top plan view and bottom plan view, respectively, of embodiments of a roofing shingle.
Figure 13:
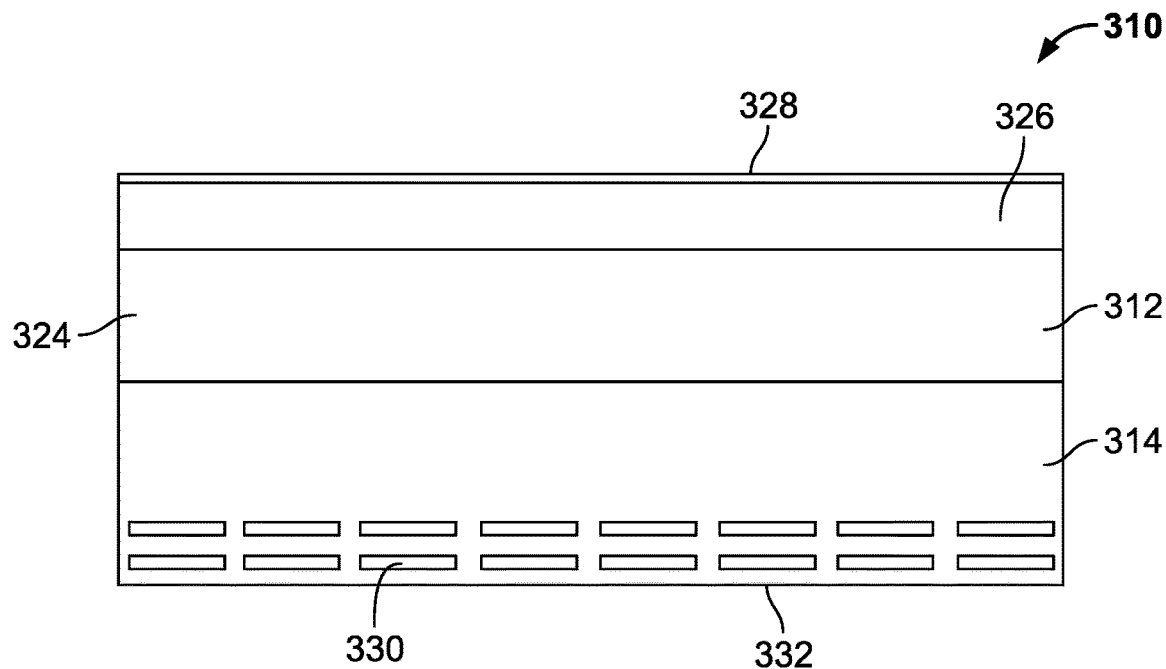

Referring to FIGS. 12 and 13, in some embodiments, a roofing shingle 310 includes a headlap portion 312 and a reveal portion 314. In some embodiments, the roofing shingle 310 includes a nailing zone 316. In some embodiments, the nailing zone 316 is intermediate the headlap portion 312 and the reveal portion 314. In some embodiments, the nailing zone 316 is configured to receive a plurality of fasteners for installing the roofing shingle 310 to a roof deck 311. In some embodiments, the fasteners are roofing nails, staples, or screws. In some embodiments, the roofing shingle 310 includes an upper layer 318 and a lower layer 320. In some embodiments, the upper layer 318 is adhered to the lower layer 320. In some embodiments, the upper layer 318 is adhered to the lower layer 320 by an adhesive. In some embodiments, the upper layer 318 and the lower layer 320 are laminated. In some embodiments, the upper layer 318 has a cut pattern. In some embodiments, the cut pattern emulates an appearance of wood shakes or roofing tiles. In some embodiments, the cut pattern includes a plurality of tabs 322. In some embodiments, each of the tabs 322 has a rectangular shape or a trapezoid shape.

In some embodiments, each of the tabs 322 has a width W1 in a range of 2 inches to 10 inches. In some embodiments, each of the tabs 322 has a width W1 in a range of 2 inches to 9 inches. In some embodiments, each of the tabs 322 has a width W1 in a range of 2 inches to 8 inches. In some embodiments, each of the tabs 322 has a width W1 in a range of 2 inches to 7 inches. In some embodiments, each of the tabs 322 has a width W1 in a range of 2 inches to 6 inches. In some embodiments, each of the tabs 322 has a width W1 in a range of 2 inches to 5 inches. In some embodiments, each of the tabs 322 has a width W1 in a range of 2 inches to 4 inches. In some embodiments, each of the tabs 322 has a width W1 in a range of 2 inches to 3 inches. In some embodiments, each of the tabs 322 has a width W1 in a range of 3 inches to 10 inches. In some embodiments, each of the tabs 322 has a width W1 in a range of 3 inches to 9 inches. In some embodiments, each of the tabs 322 has a width W1 in a range of 3 inches to 8 inches. In some embodiments, each of the tabs 322 has a width W1 in a range of 3 inches to 7 inches. In some embodiments, each of the tabs 322 has a width W1 in a range of 3 inches to 6 inches. In some embodiments, each of the tabs 322 has a width W1 in a range of 3 inches to 5 inches. In some embodiments, each of the tabs 322 has a width W1 in a range of 3 inches to 4 inches. In some embodiments, each of the tabs 322 has a width W1 in a range of 4 inches to 10 inches. In some embodiments, each of the tabs 322 has a width W1 in a range of 4 inches to 9 inches. In some embodiments, each of the tabs 322 has a width W1 in a range of 4 inches to 8 inches. In some embodiments, each of the tabs 322 has a width W1 in a range of 4 inches to 7 inches. In some embodiments, each of the tabs 322 has a width W1 in a range of 4 inches to 6 inches. In some embodiments, each of the tabs 322 has a width W1 in a range of 4 inches to 5 inches. In some embodiments, each of the tabs 322 has a width W1 in a range of 5 inches to 10 inches. In some embodiments, each of the tabs 322 has a width W1 in a range of 5 inches to 9 inches. In some embodiments, each of the tabs 322 has a width W1 in a range of 5 inches to 8 inches. In some embodiments, each of the tabs 322 has a width W1 in a range of 5 inches to 7 inches. In some embodiments, each of the tabs 322 has a width W1 in a range of 5 inches to 6 inches.

In some embodiments, each of the tabs 322 has a width W1 in a range of 6 inches to 10 inches. In some embodiments, each of the tabs 322 has a width W1 in a range of 6 inches to 9 inches. In some embodiments, each of the tabs 322 has a width W1 in a range of 6 inches to 8 inches. In some embodiments, each of the tabs 322 has a width W1 in a range of 6 inches to 7 inches. In some embodiments, each of the tabs 322 has a width W1 in a range of 7 inches to 10 inches. In some embodiments, each of the tabs 322 has a width W1 in a range of 7 inches to 9 inches. In some embodiments, each of the tabs 322 has a width W1 in a range of 7 inches to 8 inches. In some embodiments, each of the tabs 322 has a width W1 in a range of 8 inches to 10 inches. In some embodiments, each of the tabs 322 has a width W1 in a range of 8 inches to 9 inches. In some embodiments, each of the tabs 322 has a width W1 in a range of 9 inches to 10 inches. In some embodiments, each of the tabs 322 has a slant angle of 45 degrees to 135 degrees. In some embodiments, each of the tabs 322 has a slant angle of 45 degrees to 130 degrees. In some embodiments, each of the tabs 322 has a slant angle of 45 degrees to 120 degrees. In some embodiments, each of the tabs 322 has a slant angle of 45 degrees to 110 degrees. In some embodiments, each of the tabs 322 has a slant angle of 45 degrees to 100 degrees. In some embodiments, each of the tabs 322 has a slant angle of 45 degrees to 90 degrees. In some embodiments, each of the tabs 322 has a slant angle of 45 degrees to 80 degrees. In some embodiments, each of the tabs 322 has a slant angle of 45 degrees to 70 degrees. In some embodiments, each of the tabs 322 has a slant angle of 45 degrees to 60 degrees. In some embodiments, each of the tabs 322 has a slant angle of 45 degrees to 50 degrees.

In some embodiments, each of the tabs 322 has a slant angle of 50 degrees to 135 degrees. In some embodiments, each of the tabs 322 has a slant angle of 50 degrees to 130 degrees. In some embodiments, each of the tabs 322 has a slant angle of 50 degrees to 120 degrees. In some embodiments, each of the tabs 322 has a slant angle of 50 degrees to 110 degrees. In some embodiments, each of the tabs 322 has a slant angle of 50 degrees to 100 degrees. In some embodiments, each of the tabs 322 has a slant angle of 50 degrees to 90 degrees. In some embodiments, each of the tabs 322 has a slant angle of 50 degrees to 80 degrees. In some embodiments, each of the tabs 322 has a slant angle of 50 degrees to 70 degrees. In some embodiments, each of the tabs 322 has a slant angle of 50 degrees to 60 degrees. In some embodiments, each of the tabs 322 has a slant angle of 60 degrees to 135 degrees. In some embodiments, each of the tabs 322 has a slant angle of 60 degrees to 130 degrees. In some embodiments, each of the tabs 322 has a slant angle of 60 degrees to 120 degrees. In some embodiments, each of the tabs 322 has a slant angle of 60 degrees to 110 degrees. In some embodiments, each of the tabs 322 has a slant angle of 60 degrees to 100 degrees. In some embodiments, each of the tabs 322 has a slant angle of 60 degrees to 90 degrees. In some embodiments, each of the tabs 322 has a slant angle of 60 degrees to 80 degrees. In some embodiments, each of the tabs 322 has a slant angle of 60 degrees to 70 degrees.

In some embodiments, each of the tabs 322 has a slant angle of 70 degrees to 135 degrees. In some embodiments, each of the tabs 322 has a slant angle of 70 degrees to 130 degrees. In some embodiments, each of the tabs 322 has a slant angle of 70 degrees to 120 degrees. In some embodiments, each of the tabs 322 has a slant angle of 70 degrees to 110 degrees. In some embodiments, each of the tabs 322 has a slant angle of 70 degrees to 100 degrees. In some embodiments, each of the tabs 322 has a slant angle of 70 degrees to 90 degrees. In some embodiments, each of the tabs 322 has a slant angle of 70 degrees to 80 degrees. In some embodiments, each of the tabs 322 has a slant angle of 80 degrees to 135 degrees. In some embodiments, each of the tabs 322 has a slant angle of 80 degrees to 130 degrees. In some embodiments, each of the tabs 322 has a slant angle of 80 degrees to 120 degrees. In some embodiments, each of the tabs 322 has a slant angle of 80 degrees to 110 degrees. In some embodiments, each of the tabs 322 has a slant angle of 80 degrees to 100 degrees. In some embodiments, each of the tabs 322 has a slant angle of 80 degrees to 90 degrees.

In some embodiments, each of the tabs 322 has a slant angle of 90 degrees to 135 degrees. In some embodiments, each of the tabs 322 has a slant angle of 90 degrees to 130 degrees. In some embodiments, each of the tabs 322 has a slant angle of 90 degrees to 120 degrees. In some embodiments, each of the tabs 322 has a slant angle of 90 degrees to 110 degrees. In some embodiments, each of the tabs 322 has a slant angle of 90 degrees to 100 degrees. In some embodiments, each of the tabs 322 has a slant angle of 100 degrees to 135 degrees. In some embodiments, each of the tabs 322 has a slant angle of 100 degrees to 130 degrees. In some embodiments, each of the tabs 322 has a slant angle of 100 degrees to 120 degrees. In some embodiments, each of the tabs 322 has a slant angle of 100 degrees to 110 degrees. In some embodiments, each of the tabs 322 has a slant angle of 110 degrees to 135 degrees. In some embodiments, each of the tabs 322 has a slant angle of 110 degrees to 130 degrees. In some embodiments, each of the tabs 322 has a slant angle of 110 degrees to 120 degrees. In some embodiments, each of the tabs 322 has a slant angle of 120 degrees to 135 degrees. In some embodiments, each of the tabs 322 has a slant angle of 120 degrees to 130 degrees. In some embodiments, each of the tabs 322 has a slant angle of 130 degrees to 135 degrees.

In some embodiments, a rear surface 324 of the roofing shingle 310 includes an adhesive portion 326. In some embodiments, the adhesive portion 326 is located proximate to one end 328 of the roofing shingle 310. In some embodiments, the adhesive portion 326 includes an adhesive. In some embodiments, the adhesive includes tape. In some embodiments, the rear surface 324 of the roofing shingle 310 includes at least one adhesive strip 330. In some embodiments, the at least one adhesive strip 330 is located proximate to an end 332 opposite the end 328. In some embodiments, the at least one adhesive strip 330 is a peel and stick adhesive. In some embodiments, the at least one adhesive strip 330 includes a plurality of adhesive strips 330. In some embodiments, the plurality of adhesive strips 330 is arranged in a plurality of rows.

Figure 14:
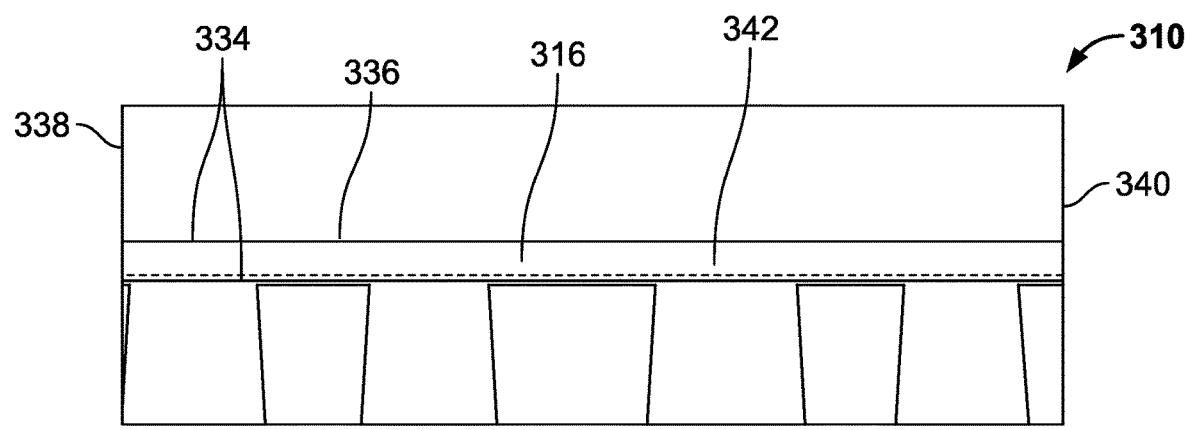
FIGS. 14 and 15 are a top plan view and bottom plan view, respectively, of embodiments of a roofing shingle.
Figure 15:
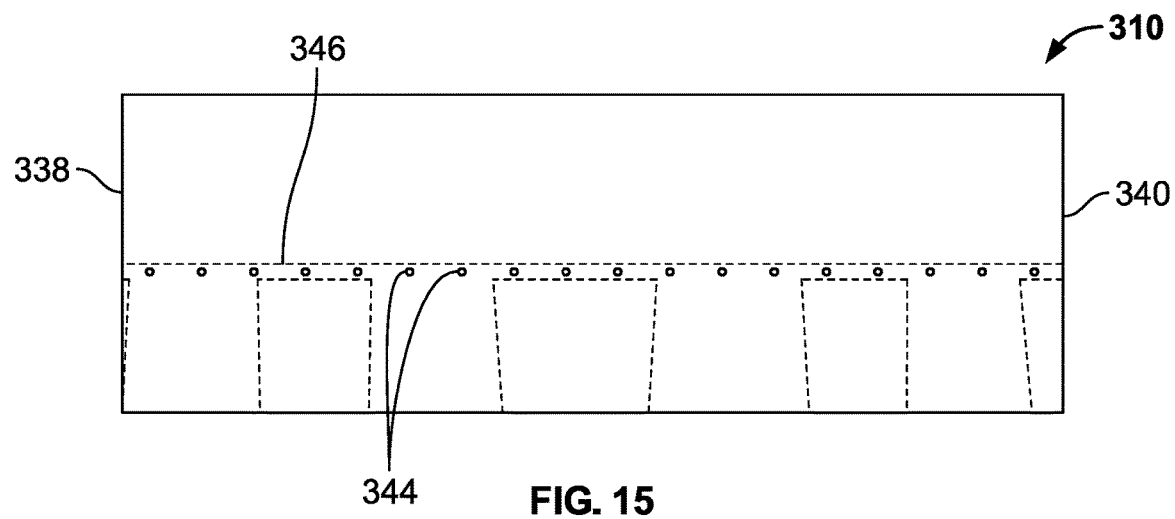
Figure 16:
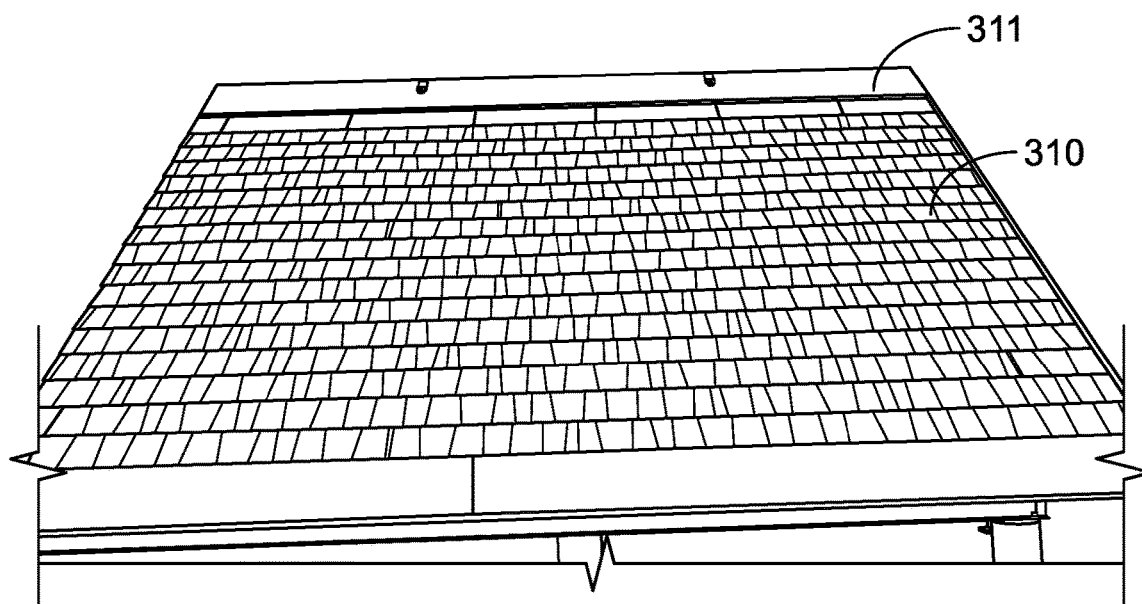
FIG. 16 is a photo of embodiments of a plurality of the roofing shingle shown in FIGS. 12 and 13 installed on a roof deck.
Figure 17:
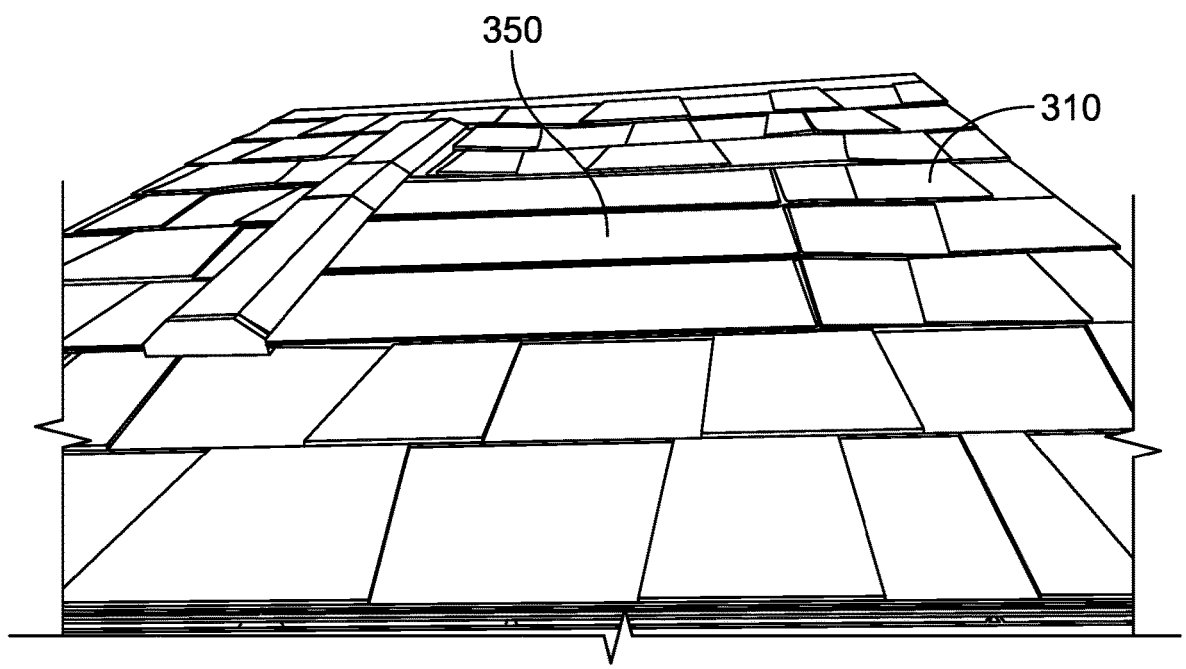
FIG. 17 is a photo of embodiments of a plurality of the roofing shingle shown in FIGS. 12 and 13 and a plurality of building integrated photovoltaic shingles installed on a roof deck.

Referring to FIG. 14, in some embodiments, the roofing shingle 310 includes paint lines 334. In some embodiments, the paint lines 334 mark the boundaries of the nailing zone 316. In some embodiments, the paint lines 334 extend across a front surface 336 of the roofing shingle 310. In some embodiments, the paint lines 334 extend from one end 338 to an opposite end 340. In some embodiments, the nailing zone 316 includes a surface 342. In some embodiments, the surface 342 is aesthetically different in appearance from the remaining portion of the head lap portion 312. In some embodiments, the surface 342 includes a textured surface. In some embodiments, the surface 342 includes granules. Referring to FIG. 15, in some embodiments, the rear surface 324 includes at least one indentation 344. In some embodiments, the at least one indentation 344 includes a plurality of indentations 344. In some embodiments, the indentations 344 are spaced apart from one another. In some embodiments, the indentations 344 are spaced apart from one another in a horizontal row. In some embodiments, the indentations 344 are located along a center line 346 of a laminating adhesive. In some embodiments, the indentations 344 facilitate the mechanical fastening of the upper layer 318 and the lower layer 320 to one another.

Referring to FIGS. 12-13 and FIGS. 16-17, in some embodiments, the roofing shingle 310 has a length L1. In some embodiments, the length L1 is 30 inches to 60 inches. In some embodiments, the length L1 is 30 inches to 50 inches. In some embodiments, the length L1 is 30 inches to 40 inches. In some embodiments, the length L1 is 40 inches to 60 inches. In some embodiments, the length L1 is 40 inches to 50 inches. In some embodiments, the length L1 is 50 inches to 60 inches.

In some embodiments, the reveal portion 314 has an exposure height A. In some embodiments, the exposure height A is 5 inches to 10 inches. In some embodiments, the exposure height A is 5 inches to 9 inches. In some embodiments, the exposure height A is 5 inches to 8 inches. In some embodiments, the exposure height A is 5 inches to 7 inches. In some embodiments, the exposure height A is 5 inches to 6 inches. In some embodiments, the exposure height A is 6 inches to 10 inches. In some embodiments, the exposure height A is 6 inches to 9 inches. In some embodiments, the exposure height A is 6 inches to 8 inches. In some embodiments, the exposure height A is 6 inches to 7 inches. In some embodiments, the exposure height A is 7 inches to 10 inches. In some embodiments, the exposure height A is 7 inches to 9 inches. In some embodiments, the exposure height A is 7 inches to 8 inches. In some embodiments, the exposure height A is 8 inches to 10 inches. In some embodiments, the exposure height A is 8 inches to 9 inches. In some embodiments, the exposure height A is 9 inches to 10 inches.

In some embodiments, the exposure height A is the same or substantially the same as an exposure height of a reveal portion of a photovoltaic shingle 350. In some embodiments, a plurality of the roofing shingles 310 and a plurality of the photovoltaic shingles 350 are installed on the roof deck 311.

In some embodiments, the photovoltaic shingle 350 is a building integrated photovoltaic shingles. In some embodiments, the roofing shingle 310 has a width W1. In some embodiments, the width W1 is two times the exposure height A plus 2 inches, i.e., W1=2A+2 inches.

In some embodiments, the width W1 is 12 inches to 22 inches. In some embodiments, the width W1 is 13 inches to 22 inches. In some embodiments, the width W1 is 14 inches to 22 inches. In some embodiments, the width W1 is 15 inches to 22 inches. In some embodiments, the width W1 is 16 inches to 22 inches. In some embodiments, the width W1 is 17 inches to 22 inches. In some embodiments, the width W1 is 18 inches to 22 inches. In some embodiments, the width W1 is 19 inches to 22 inches. In some embodiments, the width W1 is 20 inches to 22 inches. In some embodiments, the width W1 is 21 inches to 22 inches. In some embodiments, the width W1 is 12 inches to 21 inches. In some embodiments, the width W1 is 13 inches to 21 inches. In some embodiments, the width W1 is 14 inches to 21 inches. In some embodiments, the width W1 is 15 inches to 21 inches. In some embodiments, the width W1 is 16 inches to 21 inches. In some embodiments, the width W1 is 17 inches to 21 inches. In some embodiments, the width W1 is 18 inches to 21 inches. In some embodiments, the width W1 is 19 inches to 21 inches. In some embodiments, the width W1 is 20 inches to 21 inches.

In some embodiments, the width W1 is 12 inches to 20 inches. In some embodiments, the width W1 is 13 inches to 20 inches. In some embodiments, the width W1 is 14 inches to 20 inches. In some embodiments, the width W1 is 15 inches to 20 inches. In some embodiments, the width W1 is 16 inches to 20 inches. In some embodiments, the width W1 is 17 inches to 20 inches. In some embodiments, the width W1 is 18 inches to 20 inches. In some embodiments, the width W1 is 19 inches to 20 inches. In some embodiments, the width W1 is 12 inches to 19 inches. In some embodiments, the width W1 is 13 inches to 19 inches. In some embodiments, the width W1 is 14 inches to 19 inches. In some embodiments, the width W1 is 15 inches to 19 inches. In some embodiments, the width W1 is 16 inches to 19 inches. In some embodiments, the width W1 is 17 inches to 19 inches. In some embodiments, the width W1 is 18 inches to 19 inches. In some embodiments, the width W1 is 12 inches to 18 inches. In some embodiments, the width W1 is 13 inches to 18 inches. In some embodiments, the width W1 is 14 inches to 18 inches. In some embodiments, the width W1 is 15 inches to 18 inches. In some embodiments, the width W1 is 16 inches to 18 inches. In some embodiments, the width W1 is 17 inches to 18 inches.

In some embodiments, the width W1 is 12 inches to 17 inches. In some embodiments, the width W1 is 13 inches to 17 inches. In some embodiments, the width W1 is 14 inches to 17 inches. In some embodiments, the width W1 is 15 inches to 17 inches. In some embodiments, the width W1 is 16 inches to 17 inches. In some embodiments, the width W1 is 12 inches to 16 inches. In some embodiments, the width W1 is 13 inches to 16 inches. In some embodiments, the width W1 is 14 inches to 16 inches. In some embodiments, the width W1 is 15 inches to 16 inches. In some embodiments, the width W1 is 12 inches to 15 inches. In some embodiments, the width W1 is 13 inches to 15 inches. In some embodiments, the width W1 is 14 inches to 15 inches. In some embodiments, the width W1 is 12 inches to 14 inches. In some embodiments, the width W1 is 13 inches to 14 inches. In some embodiments, the width W1 is 12 inches to 13 inches.

In some embodiments, the length L1 is three (3) times the width W1. In some embodiments, the roofing shingle 310 and the photovoltaic shingle 350 aesthetically match. In some embodiments, the roofing shingle 310 and the photovoltaic shingle aesthetically match in appearance.

In some embodiments, the plurality of roofing shingles 310 are installed on the roof deck 311 in a booked pattern. In some embodiments, the plurality of roofing shingles 310 are installed on the roof deck 311 in a booked pattern in conjunction with a plurality of the photovoltaic shingles 350. In some embodiments, the plurality of roofing shingles 310 and the plurality of photovoltaic shingles 350 are installed on the roof deck 311 in a pattern that is similar to the pattern shown in FIG. 6. In some embodiments, the plurality of roofing shingles 310 and the plurality of photovoltaic shingles 350 are installed on the roof deck 311 in a pattern that is similar to the pattern shown in FIG. 7.

In some embodiments, the plurality of roofing shingles 310 and the plurality of photovoltaic shingles 350 are installed on the roof deck 311 in a pattern that is similar to the pattern shown in FIG. 8. In some embodiments, the plurality of roofing shingles 310 and the plurality of photovoltaic shingles 350 are sized, shaped and offset as described above with respect to Example 1 and shown in FIG. 8. In some embodiments, the plurality of roofing shingles 310 and the plurality of photovoltaic shingles 350 are installed on the roof deck 311 in a pattern that is similar to the pattern shown in FIG. 9. In some embodiments, the plurality of roofing shingles 310 and the plurality of photovoltaic shingles 350 are sized, shaped and offset as described above with respect to Example 2 and shown in FIG. 9. In some embodiments, the plurality of roofing shingles 310 and the plurality of photovoltaic shingles 350 are installed on the roof deck 311 in a pattern that is similar to the pattern shown in FIG. 10. In some embodiments, the plurality of roofing shingles 310 and the plurality of photovoltaic shingles 350 are sized, shaped and offset as described above with respect to Example 3 and shown in FIG. 10. In some embodiments, the plurality of roofing shingles 310 and the plurality of photovoltaic shingles 350 are installed on the roof deck 311 in a pattern that is similar to the pattern shown in FIG. 11. In some embodiments, the plurality of roofing shingles 310 and the plurality of photovoltaic shingles 350 are sized, shaped and offset as described above with respect to Example 4 and shown in FIG. 11.

It should be understood that the embodiments described herein are merely exemplary and that a person skilled in the art may make many variations and modifications without departing from the spirit and scope of the invention. All such variations and modifications are intended to be included within the scope of the invention.

What is claimed is:

1. A method, comprising the steps of:
   installing a first plurality of roofing shingles in at least one row on a roof deck;
   installing a plurality of photovoltaic shingles in a second plurality of rows on the roof deck,
      wherein the second plurality of rows is above the at least one row,
      wherein each of the plurality of photovoltaic shingles includes a first edge, a second edge opposite the first edge, and a length extending between the first and second edges;
   installing a second plurality of roofing shingles in the second plurality of rows on the roof deck,
      wherein the second plurality of roofing shingles comprises a first group of the second plurality of roofing shingles and a second group of the second plurality of roofing shingles,
         wherein the first group is located on one side of the plurality of photovoltaic shingles, and
         wherein the second group is located on an opposite side of the plurality of photovoltaic shingles,
      wherein each of the second plurality of roofing shingles includes a first length and a first edge,
      wherein the first edge of one of the first group of the second plurality of roofing shingles in each of the second plurality of rows is offset from the first edge of another one of the first group of the second plurality of roofing shingles in another adjacent one of the second plurality of rows in a direction along the first length of the another one of the first group of the second plurality of roofing shingles;
      wherein the first edge of a first photovoltaic shingle of the plurality of photovoltaic shingles is juxtaposed with the first edge of a first roofing shingle of the first group of the second plurality of roofing shingles in a first row of the second plurality of rows,
      wherein the first edge of a second photovoltaic shingle of the plurality of photovoltaic shingles in at least one of another row of the second plurality of rows is substantially aligned with the first edge of the first photovoltaic shingle,
      wherein the second edge of the second photovoltaic shingle is substantially aligned with the second edge of the first photovoltaic shingle, and
      wherein the first photovoltaic shingle is installed in a row immediately below a row in which the second photovoltaic shingle is installed;
   installing a third plurality of roofing shingles on the roof deck,
      wherein the third plurality of roofing shingles comprises a first group of the third plurality of roofing shingles and a second group of the third plurality of roofing shingles,
         wherein the first group of the third plurality of roofing shingles is located on the one side of the plurality of photovoltaic shingles,
         wherein the second group of the third plurality of roofing shingles is located on the opposite side of the plurality of photovoltaic shingles,
      wherein each of the third plurality of roofing shingles includes
         a first edge,
         a second edge opposite the first edge of the third roofing shingle, and
         a third length extending from the first edge to the second edge,
      wherein each of at least two of the first group of the third plurality of roofing shingles is installed intermediate a corresponding one of the first group of the second plurality of roofing shingles and a corresponding one of the plurality of photovoltaic shingles in each of two rows of the at least one of another of the second plurality of rows,
      wherein the first edge of each of the at least two of the first group of the third plurality of roofing shingles is juxtaposed with the first edge of the corresponding one of the plurality of photovoltaic shingles,
      wherein the second edge of one of the at least two of the first group of the third plurality of roofing shingles is offset from the second edge of another of the at least two of the first group of the third plurality of roofing shingles in a direction along the third length, and wherein the first group of the second plurality of shingles and the first group of the third plurality of shingles form a non-symmetric pattern with respect to the second group of the second plurality of shingles and the second group of the third plurality of shingles.

2. The method of claim 1, wherein each of the third plurality of roofing shingles includes a second length that is a multiple of one-quarter of the first length, one-half of the first length, three-quarters of the first length, or one of the first length.

3. The method of claim 1, wherein a total length of the at least one of the third plurality of roofing shingles in each row of the second plurality of rows increases by a multiple of one.

4. The method of claim 1, wherein a total length of the at least one of the third plurality of roofing shingles in each of every two rows of the second plurality of rows increases by a multiple of one and one-half.

5. The method of claim 1, wherein each of the first plurality of roofing shingles, the second plurality of roofing shingles, and the third plurality of roofing shingles is an asphalt shingle.

6. The method of claim 1, wherein the first length of each of the second plurality of roofing shingles in a range of 5 inches to 60 inches.

7. The method of claim 1, wherein the offset of the first edge of the one of the second plurality of roofing shingles in each of the second plurality of rows from the first edge of the another one of the second plurality of roofing shingles in the another adjacent one of the second plurality of rows is a whole number multiple of the first length of the another one of the second plurality of roofing shingles divided by an integer.

8. The method of claim 7, wherein the integer is selected from the group consisting of 1, 2, 3, 4, 5, 6, 7, 8, 9, 10, 11, 12, 13, 14, 15, 16, 17, 18, 19, and 20.

9. The method of claim 1, wherein each of the first plurality of roofing shingles, the second plurality of roofing shingles, and the third plurality of roofing shingles includes a width and a reveal portion, wherein the reveal portion includes an exposure height, and wherein the width is two times the exposure height plus 2 inches.

10. The method of claim 9, wherein each of the plurality of photovoltaic shingles includes a width, and wherein the width of each of the first plurality of roofing shingles, the second plurality of roofing shingles, and the third plurality of roofing shingles is substantially the same as the width of the photovoltaic shingles.

11. A system, comprising:
a first plurality of roofing shingles installed in at least one row on a roof deck;
a second plurality of roofing shingles installed in a second plurality of rows on the roof deck,
wherein the second plurality of roofing shingles comprises a first group of the second plurality of roofing shingles and a second group of the second plurality of roofing shingles,
wherein the second plurality of rows is above the at least one row,
wherein each of the second plurality of roofing shingles includes a first length and a first edge,
wherein the first edge of one of the second plurality of roofing shingles in each of the second plurality of rows is offset from the first edge of another one of the second plurality of roofing shingles in another adjacent one of the second plurality of rows in a direction along the first length of the another one of the second plurality of roofing shingles;
a plurality of photovoltaic shingles installed on the roof deck,
wherein each of the plurality of photovoltaic shingles includes a first edge, a second edge opposite the first edge, and a length extending between the first and second edges,
wherein the first group of the second plurality of roofing shingles is located on one side of the plurality of photovoltaic shingles,
wherein the second group of the second plurality of roofing shingles is located on an opposite side of the plurality of photovoltaic shingles,
wherein the first edge of a first photovoltaic shingle of the plurality of photovoltaic shingles is juxtaposed with the first edge of a first roofing shingle of the first group of the second plurality of roofing shingles in a first row of the second plurality of rows,
wherein the first edge of a second photovoltaic shingle of the plurality of photovoltaic shingles in at least one of another row of the second plurality of rows is substantially aligned with the first edge of the first photovoltaic shingle,
wherein the second edge of the second photovoltaic shingle is substantially aligned with the second edge of the first photovoltaic shingle, and
wherein the first photovoltaic shingle is installed in a row immediately below a row in which the second photovoltaic shingle is installed; and
a third plurality of roofing shingles installed on the roof deck,
wherein the third plurality of roofing shingles comprises a first group of the third plurality of roofing shingles and a second group of the third plurality of roofing shingles,
wherein the first group of the third plurality of roofing shingles is located on the one side of the plurality of photovoltaic shingles,
wherein the second group of the third plurality of roofing shingles is located on the opposite side of the plurality of photovoltaic shingles,
wherein at least one of the first group of the third plurality of roofing shingles is installed intermediate a corresponding one of the first group of the second plurality of roofing shingles and one of the plurality of photovoltaic shingles in each of the at least one of another of the second plurality of rows, and
wherein the first group of the second plurality of shingles and the first group of the third plurality of shingles form a non-symmetric pattern with respect to the second group of the second plurality of shingles and the second group of the third plurality of shingles.

12. The system of claim 11, wherein each of the third plurality of roofing shingles includes a second length that is a multiple of one-quarter of the first length, one-half of the first length, three-quarters of the first length, or one of the first length.

13. The system of claim 11, wherein a total length of the at least one of the third plurality of roofing shingles in each row of the second plurality of rows increases by a multiple of one.

14. The system of claim 11, wherein a total length of the at least one of the third plurality of roofing shingles in each of every two rows of the second plurality of rows increases by a multiple of one and one-half.

15. The system of claim 11, wherein each of the first plurality of roofing shingles, the second plurality of roofing shingles, and the third plurality of roofing shingles is an asphalt shingle.

16. The system of claim 11, wherein the first length of each of the second plurality of roofing shingles in a range of 10 inches to 60 inches.

17. The system of claim 11, wherein the offset of the first edge of the one of the second plurality of roofing shingles in each of the second plurality of rows from the first edge of the another one of the second plurality of roofing shingles in the another adjacent one of the second plurality of rows is a whole number multiple of the first length of the another one of the second plurality of roofing shingles divided by an integer.

18. The system of claim 17, wherein the integer is selected from the group consisting of 1, 2, 3, 4, 5, 6, 7, 8, 9, 10, 11, 12, 13, 14, 15, 16, 17, 18, 19, and 20.

19. The system of claim 11, wherein each of the first plurality of roofing shingles, the second plurality of roofing shingles, and the third plurality of roofing shingles includes a width and a reveal portion, wherein the reveal portion includes an exposure height, and wherein the width is two times the exposure height plus 2 inches.

20. The system of claim 19, wherein each of the plurality of photovoltaic shingles includes a width, and wherein the width of each of the first plurality of roofing shingles, the second plurality of roofing shingles, and the third plurality of roofing shingles is substantially the same as the width of the photovoltaic shingles.

* * * * *